US012586842B2

(12) United States Patent
Wright et al.

(10) Patent No.: US 12,586,842 B2
(45) Date of Patent: **\*Mar. 24, 2026**

(54) METHODS OF OPERATING SWAPPABLE BATTERY MODULES COMPRISING IMMERSION-THERMALLY CONTROLLED PRISMATIC BATTERY CELLS

(71) Applicant: DIMAAG-AI, Inc., Fremont, CA (US)

(72) Inventors: Ian Wright, Woodside, CA (US); David Kieke, Carmine, TX (US)

(73) Assignee: DIMAAG-AI, Inc., Fremont, CA (US)

( \* ) Notice: Subject to any disclaimer, the term of this patent is extended or adjusted under 35 U.S.C. 154(b) by 372 days.

This patent is subject to a terminal disclaimer.

(21) Appl. No.: 18/449,507

(22) Filed: Aug. 14, 2023

(65) Prior Publication Data

US 2024/0304898 A1 Sep. 12, 2024

Related U.S. Application Data

(63) Continuation of application No. 18/182,912, filed on Mar. 13, 2023, now Pat. No. 11,784,369.

(Continued)

(51) Int. Cl.
*H01M 10/6568* (2014.01)
*B60L 53/80* (2019.01)
(Continued)

(52) U.S. Cl.
CPC ......... *H01M 10/6568* (2015.04); *B60L 53/80* (2019.02); *H01M 10/613* (2015.04);
(Continued)

(58) Field of Classification Search
CPC ........... H01M 10/6568; H01M 10/613; H01M 10/647; H01M 50/209; H01M 50/244;
(Continued)

(56) References Cited

U.S. PATENT DOCUMENTS 6,111,387 A 8/2000 Kouzu et al.
11,784,369 B1 10/2023 Wright et al.
(Continued)

FOREIGN PATENT DOCUMENTS

CN 216058294 U 3/2022
DE 102019114765 \* 10/2020
(Continued)

OTHER PUBLICATIONS

"Dry Break Quick Disconnects", DCX The Liquid Cooling Company; Retrieved from the Internet on Mar. 9, 2023: https://dcx.eu/quick-disconnects/.
(Continued)

*Primary Examiner* — Lisa S Park
(74) *Attorney, Agent, or Firm* — Polygon IP, LLP

(57) ABSTRACT

Described herein are swappable battery modules comprising immersion-thermally controlled prismatic battery cells and methods of operating thereof. A module comprises a tubular enclosure attached (e.g., glued) to different surfaces of the cells and forming two fluid channels with one side of the cells and two additional fluid channels with the opposite side. The module also comprises a first end plate, which is attached to the tubular enclosure and comprises two electrical terminals for connecting to an electric vehicle (EV) and/or external charger. The first end plate also comprises a first fluidic port (fluidically coupled with two fluid channels) and a second fluidic port (fluidically coupled to the remaining two fluid channels), both are configured to form fluidic coupling to the electric vehicle and/or the external charger. The module also comprises a second end plate that fluidically interconnects paid fluid channels from different cell sides.

20 Claims, 14 Drawing Sheets

Related U.S. Application Data

(60) Provisional application No. 63/489,488, filed on Mar. 10, 2023.

(51) Int. Cl.

| | |
|---|---|
| *H01M 10/613* | (2014.01) |
| *H01M 10/63* | (2014.01) |
| *H01M 10/647* | (2014.01) |
| *H01M 50/209* | (2021.01) |
| *H01M 50/244* | (2021.01) |
| *H01M 50/258* | (2021.01) |
| *H01M 50/367* | (2021.01) |
| *H01M 50/507* | (2021.01) |
| *H01M 50/55* | (2021.01) |
| *H05K 7/20* | (2006.01) |
| *H01M 10/42* | (2006.01) |

(52) U.S. Cl.
CPC ....... *H01M 10/647* (2015.04); *H01M 50/209* (2021.01); *H01M 50/244* (2021.01); *H01M 50/258* (2021.01); *H01M 50/367* (2021.01); *H01M 50/507* (2021.01); *H01M 50/55* (2021.01); *H05K 7/20236* (2013.01); *H01M 2010/4271* (2013.01)

(58) Field of Classification Search
CPC ............. H01M 50/258; H01M 50/367; H01M 50/507; H01M 50/55; H01M 2010/4271; H01M 10/615; H01M 10/625; H01M 10/6553; H01M 10/6556; H01M 50/3425; H01M 50/358; H01M 2220/20; B60L 53/80; H05K 7/20236; Y02E 60/10
See application file for complete search history.

(56) References Cited

U.S. PATENT DOCUMENTS

| | | | | |
|---|---|---|---|---|
| 12,087,959 | B1 | 9/2024 | Wright et al. | |
| 12,170,360 | B2 | 12/2024 | Wright | |
| 2010/0104927 | A1 | 4/2010 | Albright | |
| 2014/0111161 | A1* | 4/2014 | Kim ...................... | H02J 7/0068 |
| | | | | 320/128 |
| 2014/0141298 | A1* | 5/2014 | Michelitsch ........ | H01M 10/647 |
| | | | | 429/71 |
| 2015/0122562 | A1* | 5/2015 | Miyashiro ........... | H01M 50/296 |
| | | | | 180/68.5 |
| 2015/0357684 | A1 | 12/2015 | Willgert et al. | |
| 2016/0268564 | A1 | 9/2016 | Cho et al. | |
| 2016/0272043 | A1 | 9/2016 | Cheng | |
| 2017/0077566 | A1* | 3/2017 | Mascianica ....... | H01M 10/6556 |
| 2017/0232865 | A1* | 8/2017 | Christen ............ | B60H 1/00278 |
| | | | | 429/120 |
| 2019/0379093 | A1 | 12/2019 | Choi et al. | |
| 2020/0185793 | A1 | 6/2020 | Itaya et al. | |
| 2020/0266507 | A1 | 8/2020 | Brunnsteiner et al. | |
| 2020/0287181 | A1 | 9/2020 | You et al. | |
| 2022/0045388 | A1 | 2/2022 | Coupar et al. | |
| 2022/0407145 | A1* | 12/2022 | Devarakonda .... | H01M 10/6568 |
| 2023/0059541 | A1 | 2/2023 | Yoon | |
| 2023/0238611 | A1 | 7/2023 | Gao | |
| 2023/0238814 | A1 | 7/2023 | Lu et al. | |
| 2023/0246266 | A1 | 8/2023 | Andruskiewicz, IV et al. | |
| 2024/0250341 | A1 | 7/2024 | Wright | |
| 2024/0304927 | A1 | 9/2024 | Wright et al. | |
| 2024/0421379 | A1 | 12/2024 | Wright et al. | |
| 2025/0118831 | A1 | 4/2025 | Wright et al. | |
| 2025/0266528 | A1 | 8/2025 | Wright et al. | |

FOREIGN PATENT DOCUMENTS

| | | | |
|---|---|---|---|
| WO | WO2020/177738 | * | 9/2020 |
| WO | 2024191766 A1 | | 9/2024 |

OTHER PUBLICATIONS

"Series HC: Clean-break couplings for high-pressure hydraulic applications", Walther-Prazision; Retrieved from the Internet on Mar. 9, 2032: https://www.walther-praezision.de/en/products/mono_couplings/clean_break_up_to_650_bar_10000_psi/series_hc/index.html.

U.S. Appl. No. 18/182,912, Non Final Office Action mailed May 19, 2023, 23 pgs.

U.S. Appl. No. 18/182,912, Notice of Allowance mailed Jun. 22, 2023, 7 pgs.

Wilhelm, Grant, "6 traits of non-spill connectors", Connector Tips Editor, Feb. 3, 2015; Retrieved from the Internet: https://www.connectortips.com/6-traits-non-spill-connectors/.

U.S. Appl. No. 18/402,347, Non Final Office Action mailed Apr. 2, 2024, 19 pgs.

U.S. Appl. No. 18/418,102, Non Final Office Action mailed Apr. 28, 2024, 12 pgs.

U.S. Appl. No. 18/402,347, Notice of Allowance mailed May 10, 2024, 7 pgs.

U.S. Appl. No. 18/418,102, Notice of Allowance mailed Aug. 14, 2024, 9 pgs.

* cited by examiner

160

162

164

Z

Y ← → X

400

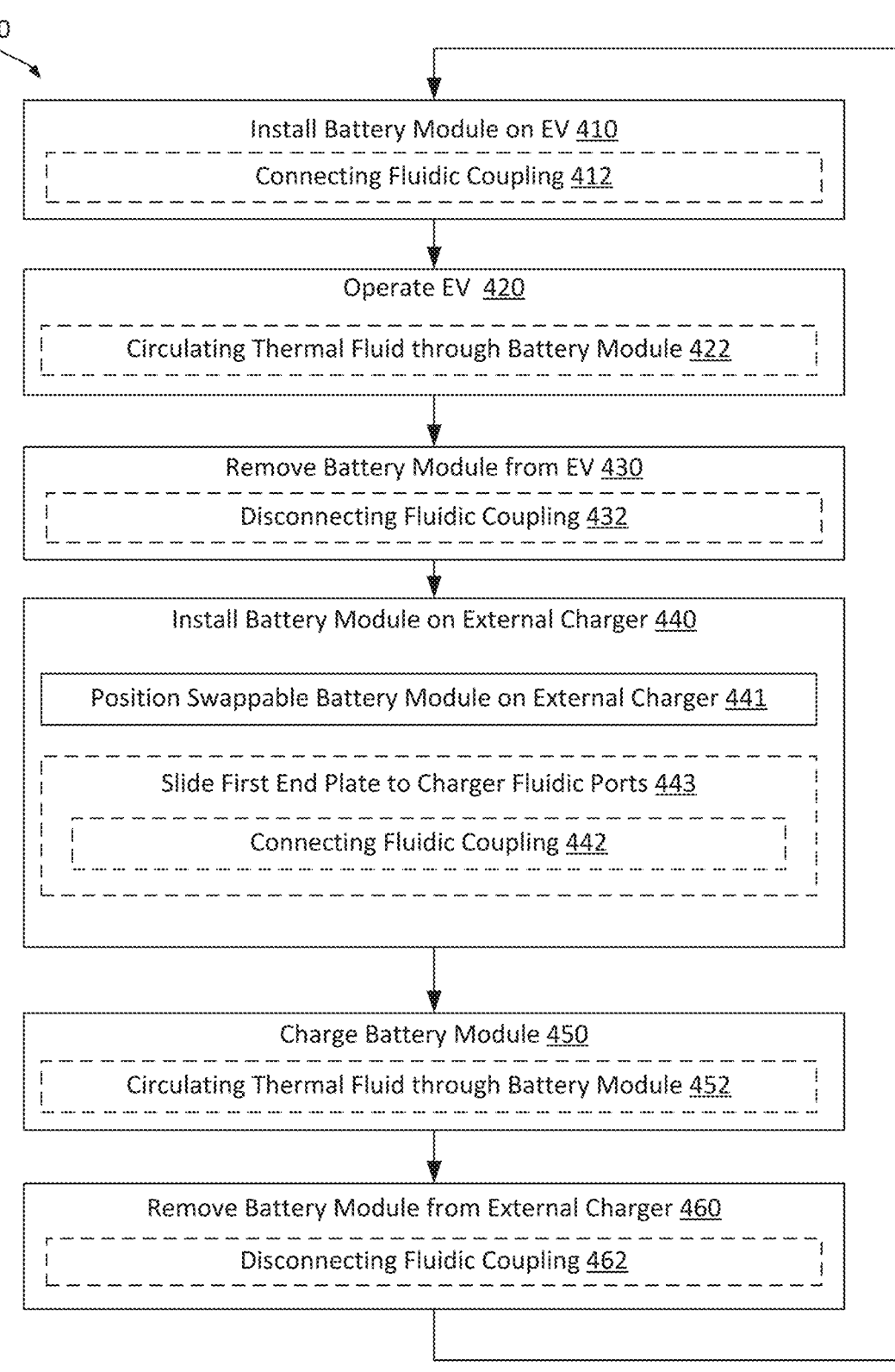

Install Battery Module on EV 410

Connecting Fluidic Coupling 412

Operate EV  420

Circulating Thermal Fluid through Battery Module 422

Remove Battery Module from EV 430

Disconnecting Fluidic Coupling 432

Install Battery Module on External Charger 440

Position Swappable Battery Module on External Charger 441

Slide First End Plate to Charger Fluidic Ports 443

Connecting Fluidic Coupling 442

Charge Battery Module 450

Circulating Thermal Fluid through Battery Module 452

Remove Battery Module from External Charger 460

Disconnecting Fluidic Coupling 462

*FIG. 4*

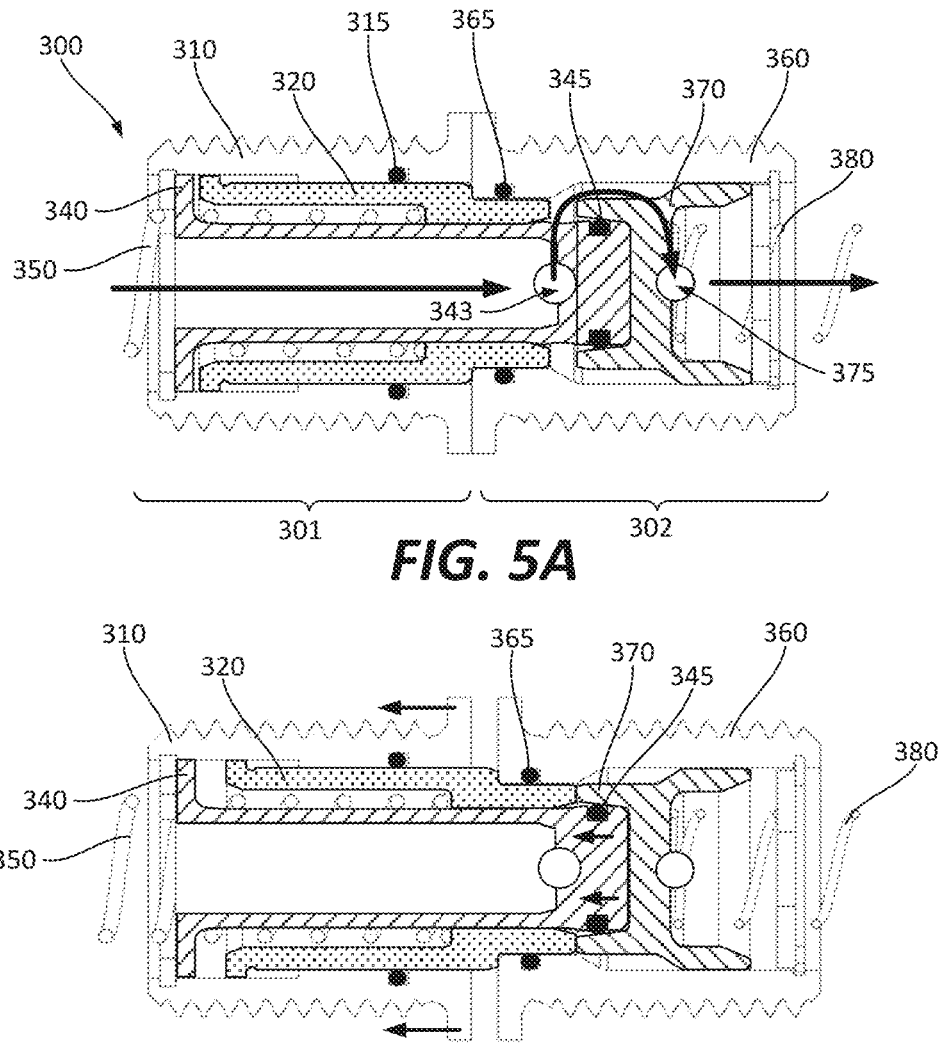
FIG. 5A
FIG. 5B
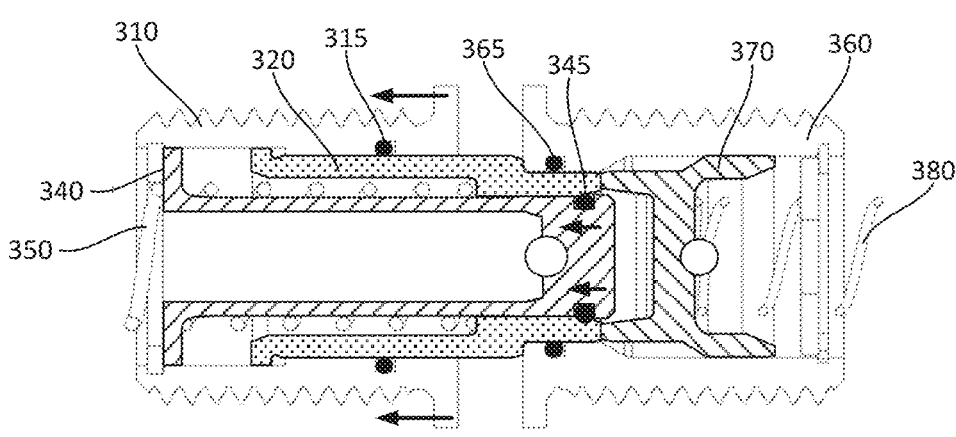
FIG. 5C

METHODS OF OPERATING SWAPPABLE BATTERY MODULES COMPRISING IMMERSION-THERMALLY CONTROLLED PRISMATIC BATTERY CELLS

CROSS-REFERENCE TO RELATED APPLICATIONS

This application is a continuation of U.S. patent application Ser. No. 18/182,912, filed on 2023 Mar. 13, which claims the benefit under 35 U.S.C. § 119(e) of US Provisional Patent Application No. 63/489,488, filed on 2023 Mar. 10, both of which are incorporated herein by reference in their entirety for all purposes.

BACKGROUND

Electric vehicles are propelled using electric motors powered by battery packs. Each battery pack can include one or more battery modules, each comprising one or more battery cells. These cells can be connected in series and/or parallel and controlled by a battery management system. While the operating temperature of battery cells depends on various materials used to fabricate these cells (e.g., electrolyte solvents), most battery cells are designed to operate in the 0-60° C. range. It should be noted that battery cells can be very sensitive to their operating temperatures. For example, the power rating of battery cells can drop quickly with the temperature (caused by lower ionic mobility). At the same time, battery cells degrade faster and can potentially enter unsafe conditions when operated at high temperatures.

In addition to various environmental conditions that can change cells' operating temperature, battery cells can generate considerable heat while charging and discharging, especially at high rates (that can be desirable for many applications). For example, Joule heating caused by cells' internal resistance is one of the largest contributors. Other contributors include but are not limited to electrode reactions and entropic heat generation caused by the insertion and de-insertion of lithium ions in and out of the electrodes. To maintain optimum operating temperatures, the heat must be removed from the battery cells as this heat is being generated within the cells. It should be noted that other components of battery packs (e.g., bus bars that interconnect battery cells) can also cause heating and should be also cooled whenever possible.

Liquid cooling or, more generally, liquid-based thermal management of battery cells is beneficial in comparison to, e.g., air cooling because of the large heat capacities and heat transfer coefficient of many liquids in comparison to air. However, controlling the distribution of liquid within battery packs can be challenging. For example, most liquid-cooled battery packs have battery cells isolated from liquid passages thereby preventing any direct contact between the cells and thermal fluid and relying on various heat-transferring components positioned in between. Furthermore, many liquid-cooled battery packs utilize cylindrical cells (e.g., 18650 cells) because of their small factor and ease of cooling (e.g., by thermal coupling to cell bottoms). However, battery packs with cylindrical cells tend to have lower energy density because of their inherent packing density limitations. Additionally, most battery cooling systems focus on cooling batteries and ignore bus bar cooling. At the same time, the bus bar cooling can prevent the overheating of bus bars and even allow using bus bars with smaller cross-sections (for a given current). Finally, liquid-cooled battery modules are generally stationary (e.g., permanently positioned on electric vehicles). At the same time, many applications (e.g., smaller electric vehicles) can benefit from swappable batteries that, for example, can be charged remotely and that can also be liquid-cooled (e.g., while on the vehicle and/or on the external charger). However, forming/severing the liquid connections to a module in a fast and efficient manner can be challenging.

What is needed are new swappable battery modules comprising immersion-thermally controlled prismatic battery cells and methods of operating thereof.

SUMMARY

Described herein are swappable battery modules comprising immersion-thermally controlled prismatic battery cells and methods of operating thereof. A module comprises a tubular enclosure attached (e.g., glued) to different surfaces of the cells and forming two fluid channels with one side of the cells and two additional fluid channels with the opposite side. The module also comprises a first end plate, which is attached to the tubular enclosure and comprises two electrical terminals for connecting to an electric vehicle (EV) and/or external charger. The first end plate also comprises a first fluidic port (fluidically coupled with two fluid channels) and a second fluidic port (fluidically coupled to the remaining two fluid channels), both are configured to form fluidic coupling to the electric vehicle and/or the external charger. The module also comprises a second end plate that fluidically interconnects paid fluid channels from different cell sides.

In some examples, a swappable battery module comprises prismatic battery cells, bus bars, a tubular enclosure, a first end plate, and a second end plate. The prismatic battery cells comprise a first-end cell and a second-end cell. The prismatic battery cells are stacked along a primary axis of the swappable battery module between the first-end cell and the second-end cell. The prismatic battery cells comprise first surfaces, second surfaces opposite to the first surfaces, and side surfaces extending between the first surfaces and the second surfaces. The prismatic battery cells comprise cell terminals positioned on the first surfaces. The bus bars form at least a first bus-bar row and a second bus-bar row and interconnect the cell terminals. The tubular enclosure is attached to each of the first surfaces, the second surfaces, and the side surfaces of the prismatic battery cells. The tubular enclosure forms a first fluid channel and a second fluid channel with a portion of the first surfaces such that the first bus-bar row extends within the first fluid channel while the second bus-bar row extends within the second fluid channel. The tubular enclosure forms a third fluid channel and a fourth fluid channel with a portion of the second surface. The first end plate is attached to the tubular enclosure and comprises a first fluidic port fluidically coupled to both the first fluid channel and the third fluid channel and a second fluidic port fluidically coupled to both the second fluid channel and the fourth fluid channel. The first end also comprises a first electrical terminal and a second electrical terminal electrically coupled to the bus bars. The second end plate is attached to the tubular enclosure, fluidically interconnects the first fluid channel and the third fluid channel, and fluidically interconnects the second fluid channel and the fourth fluid channel (independently from the first fluid channel and the third fluid channel).

In some examples, the tubular enclosure comprises a first enclosure portion and a second enclosure portion, each independently attached to each of the first surfaces, the second surfaces, and the side surfaces of the prismatic battery cells and further attached to each of the first end plate and the second end plate. In some examples, the tubular enclosure further comprises an interconnecting portion, attached to each of the first enclosure portion and the second enclosure portion and forming a gas-ventilation channel with the first surfaces of the prismatic battery cells. The prismatic battery cells comprise pressure-release burst valves positioned on the first surfaces and in fluid communication with the gas-ventilation channel. In some examples, the swappable battery module further comprises sensor wires, functionally coupled to each of the prismatic battery cells and protruding within the gas-ventilation channel to the first end plate. In some examples, the swappable battery module further comprises a handle coupled to the tubular enclosure, proximate to the second surfaces of the prismatic battery cells such that prismatic battery cells are positioned between the bus bars and the handle.

In some examples, a portion of the first end plate protrudes into and is glued to the tubular enclosure. Furthermore, a portion of the second end plate protrudes into and is glued to the tubular enclosure. In some examples, the first end plate is glued to the first-end cell, while the second end plate is glued to the second-end cell. In some examples, the tubular enclosure is glued to each of the first surfaces, the second surfaces, and the side surfaces of each of the prismatic battery cells. The tubular enclosure is electrically isolated from each of the prismatic battery cells. In some examples, each adjacent pair of prismatic battery cells is mechanically interconnected by an adhesive layer extending between the prismatic battery cells in each adjacent pair. In some examples, the adhesive layer has an annulus shape.

In some examples, the bus bars form at least a third bus-bar row (e.g., a return bus bar) extending within the second fluid channel. One of the bus bars in the first bus-bar row is electrically coupled to the first electrical terminal. One of the bus bars in the third bus-bar row is electrically coupled to the second electrical terminal. In some examples, each of the first bus-bar row and the second bus-bar row comprises multiple disjoined components. In more specific examples, each of the multiple disjoined components comprises two planar portions and an interconnecting rib, joining the two planar portions. The two planar portions are connected to the cell terminals of two adjacent ones of the prismatic battery cells. The interconnecting rib protrudes from the two planar portions and in a direction away from the prismatic battery cells and comprises one or fluid path openings.

In some examples, the first end plate comprises a center protrusion and two side edges, extending along the side surfaces of the first-end cell. The two side edges and the center protrusion from edge channels fluidically coupling the first fluid channel and the third fluid channel and, separately, fluidically coupling the second fluid channel and the fourth fluid channel.

In some examples, the swappable battery module further comprises sensor wires functionally coupled to each of the prismatic battery cells. The swappable battery module also comprises a battery management system, electronically coupled to each of the sensor wires. The first end plate comprises an outer cavity such that the battery management system is positioned with the outer cavity. The first end plate further comprises a passthrough such that the sensor wires protrude through the passthrough and are sealed within the passthrough.

In some examples, the second end plate comprises a first cavity fluidically coupling the first fluid channel and the second fluid channel. The second end plate further comprises a second cavity fluidically coupling the third fluid channel and the fourth fluid channel.

In some examples, each of the first fluidic port and the second fluidic port is configured to form a fluidic coupling with a corresponding fluidic port on one or both of an electrical vehicle and an external charger. For example, the fluidic coupling comprises a first component and a second component, configured to form a sealed fluidically coupling with each other in a coupled state and to disconnect from each other while transitioning into a decoupled state. The first component comprises a first body, a first seal, a first spool, a first spool seal, a slider, a first slider seal, and a first spring. The first spool is slidably coupled to the first body and to the slider and biased, relative to the first body, by the first spring. The first spool is sealed against the first body by the first seal. The second component comprises a second body, a second seal, a second spool, and a second spring. The second spool is slidably coupled to and biased, by the second spring, relative to the second body. When the fluidic coupling is in the coupled state, the first spool extends into the second body and is sealed against the second body by the second seal. When the fluidic coupling is in the decoupled state, the first spool is sealed relative to the slider by the first slider seal while the second spool is sealed relative to the second body by the second seal. In some examples, each of the first fluidic port and the second fluidic port is the second component of the fluidic coupling.

Also provided a method of operating a swappable battery module. In some examples, the method comprises positioning the swappable battery module on an external charger comprising charger fluidic ports. The swappable battery module comprises prismatic battery cells, a tubular enclosure, attached to and enclosing the prismatic battery cells, a first end plate attached to the tubular enclosure, and a second end plate attached to the tubular enclosure. The tubular enclosure forms a first fluid channel, a second fluid channel, a third fluid channel, and a fourth fluid channel with the prismatic battery cells. The first end plate comprises a first fluidic port, fluidically coupled to both the first fluid channel and the third fluid channel, and a second fluidic port, fluidically coupled to both the second fluid channel and the fourth fluid channel. The second end plate fluidically interconnects the first fluid channel and the third fluid channel and, separately, fluidically interconnects the second fluid channel and the fourth fluid channel. In some examples, the method also comprises sliding the first end plate toward the charger fluidic ports until the charger fluidic ports are fluidically coupled with the first fluidic port and the second fluidic port.

BRIEF DESCRIPTION OF THE DRAWINGS

FIG. 4 is a process flowchart of a method for operating a battery module, in accordance with some examples.

FIGS. 5A-5F are schematic cross-sectional side views of a fluidic coupling at different stages while decoupling the first component from the second component, in accordance with some examples.

DETAILED DESCRIPTION

Figure 1:
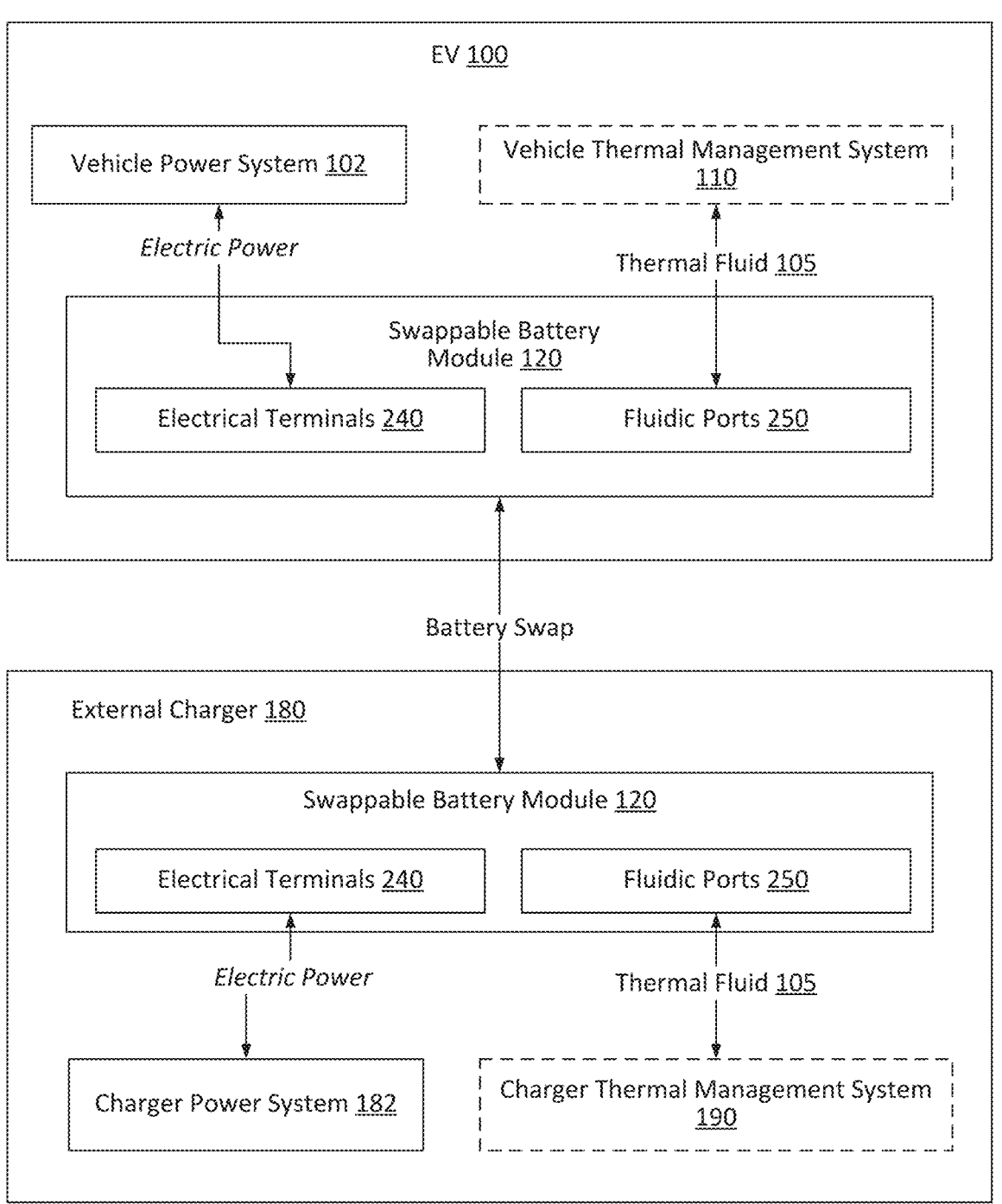
FIG. 1 is a block diagram of a system comprising an electric vehicle, an external charger, and a swappable battery module that can be interchangeably connected to either the electric vehicle or the external charger, in accordance with some examples.

In the following description, numerous specific details are outlined to provide a thorough understanding of the present invention. The present invention may be practiced without some or all of these specific details. In other instances, well-known process operations have not been described in detail to avoid obscuring the present invention. While the invention will be described in conjunction with the specific examples, it will be understood that it is not intended to limit the invention to the examples.

INTRODUCTION

As noted above, battery cells can be very sensitive to operating temperatures. At the same time, these temperatures can be influenced by the environment and/or by the cells' operation (e.g., self-heating during fast charge/discharge). Liquid-based thermal management provides efficient ways to control the temperature of battery cells. However, the thermal coupling of battery cells and thermal fluid can be challenging. The immersion cooling of battery cells brings battery cells in direct contact with thermal fluids, which is beneficial for thermal transfer (in comparison to positioning intermediate structures between the cells and thermal fluids, e.g., to enclose the thermal fluid). The key challenges include controlling the distribution and flow of thermal fluids around battery cells and other components (e.g., bus bars).

Described herein are battery modules comprising immersion-thermally controlled prismatic battery cells and methods of operating thereof. Specifically, each battery cell comes in direct contact with a thermal fluid (e.g., transformer oil) at multiple locations, e.g., two locations on the first surface of these battery cells and two additional locations on the second surface, opposite of the first surface. Furthermore, the thermal fluid is circulated in such a way that all experience substantially the same heat transfer driven by the temperature difference between the cells and fluid. Furthermore, even when the thermal fluid is not circulated, the fluid remaining in the battery module provides an additional thermal mass and thermal pathways between the cells and other components of the battery modules. For example, at certain operating conditions (e.g., discharge/charge rates of at or less than 5C, at or less than 2C, or even at or less than 1C), no circulation of the thermal fluid may be provided. Specifically, no fluid circulating may be provided while a batter module is positioned on a vehicle. However, at higher discharge/charge rates (e.g. at or greater than 5C, at or greater than 8C, or even at or greater than 10C), the thermal fluid can be circulated through the module (e.g., when the module is connected to an external charger thereby enabling high charge rates). Specifically, the thermal fluid may be circulated through the battery module as well as between the module and an external cooling system, wherein the thermal fluid is cooled before being returned to the module. It should be noted that immersion-thermally control may involve cooling and/or heating.

In some examples, battery cells are glued together for the structural integrity of the resulting battery module. The adhesive layers provided between the cells can also be used for the electrical isolation of battery cells and, to some extent, for the thermal isolation of the cells (both of which are safety measures). Furthermore, the direct attachment of the battery cells effectively provides some internal structural support (e.g., a module skeleton) and reduces the structural requirements from the external components, thereby reducing the weight/size of these components (and increasing the gravimetric/volumetric capacity of the module). The external support is provided by an enclosure.

Battery modules described herein can be used to power electric vehicles and can be charged using external chargers. FIG. 1 is a schematic block diagram illustrating battery module 120 being swapped between electric vehicle 100 (to power electric vehicle 100) and external charger 180 (to recharge battery module 120). Hence battery module 120 may be also referred to as a swappable battery module 120. For purposes of this disclosure, the terms "battery module" and "swappable battery module" are used interchangeably. Furthermore, battery module 120 may be also referred to as an immersion-thermally controlled battery module since the cells within the module are in direct contact with the thermal fluid as described below.

While on electric vehicle 100, battery module 120 is electrically connected to vehicle power system 102, e.g., inverters, electric motors, and other like devices. Various types of electric vehicles 100 (e.g., tractors, rugged terrain vehicles (RTVs), all-terrain vehicles (ATVs), industrial electric vehicles such as loaders, forklifts, and the like) are within the scope. In some examples, battery module 120 can also be fluidically connected to vehicle thermal management system 110, which allows circulating thermal fluid 105 between vehicle thermal management system 110 and battery module 120. Vehicle thermal management system 110 is optional and, in some examples, battery module 120 does not form any fluidic connections to any systems on electric vehicle 100. When such a connection is formed, the circulation of thermal fluid 105 can be used to control the temperature of battery module 120 or, more specifically, the temperature of the battery cells forming this battery module 120. For example, electric vehicle 100 (e.g., snowmobiles, ATVs) can be operated at environmental temperatures that are outside of the desired cell temperature range. In the same or other examples, the power demand from vehicle power system 102 can cause significant heating of the battery cells (e.g., exceeding the environmental cooling rate of battery module 120). Vehicle thermal management system 110 can be configured to provide thermal fluid 105 at a desired temperature range (e.g., between 10° C. and 30°) to assist with cooling and/or heating of battery module 120. In some examples, vehicle thermal management system 110 is equipped with one of a heat pump, a heater, a radiator, and the like.

While on external charger 180, battery module 120 is electrically connected to charger power system 182. In some examples, battery module 120 can also be fluidically connected to charger thermal management system 190. Charger thermal management system 190 is optional and, in some examples, battery module 120 does not form any fluidic connections to any systems on external charger 180. When such a connection is formed, this connection allows circulating thermal fluid 105 between charger thermal management system 190 and battery module 120. As noted above, this circulation of thermal fluid 105 can be used to control the temperature of battery module 120 or, more specifically, the temperature of the battery cells forming this battery module 120. In addition to environmental temperature considerations, this circulation allows the use of high charge rates (e.g., greater than 2C, greater than 5C, and even as high as 10C or greater) without the risk of overheating the cells. Charge currents (similar to discharge currents) caused the internal cell heating. The circulation of thermal fluid 105 allows for the efficient removal of this generated heat thereby allowing higher charge rates and faster charging. In some examples, charger thermal management system 190 is equipped with one of a heat pump, a heater, a radiator, and the like. Examples of fluidic connections are described below with reference to FIGS. 5A-5F.

Figure 2A:
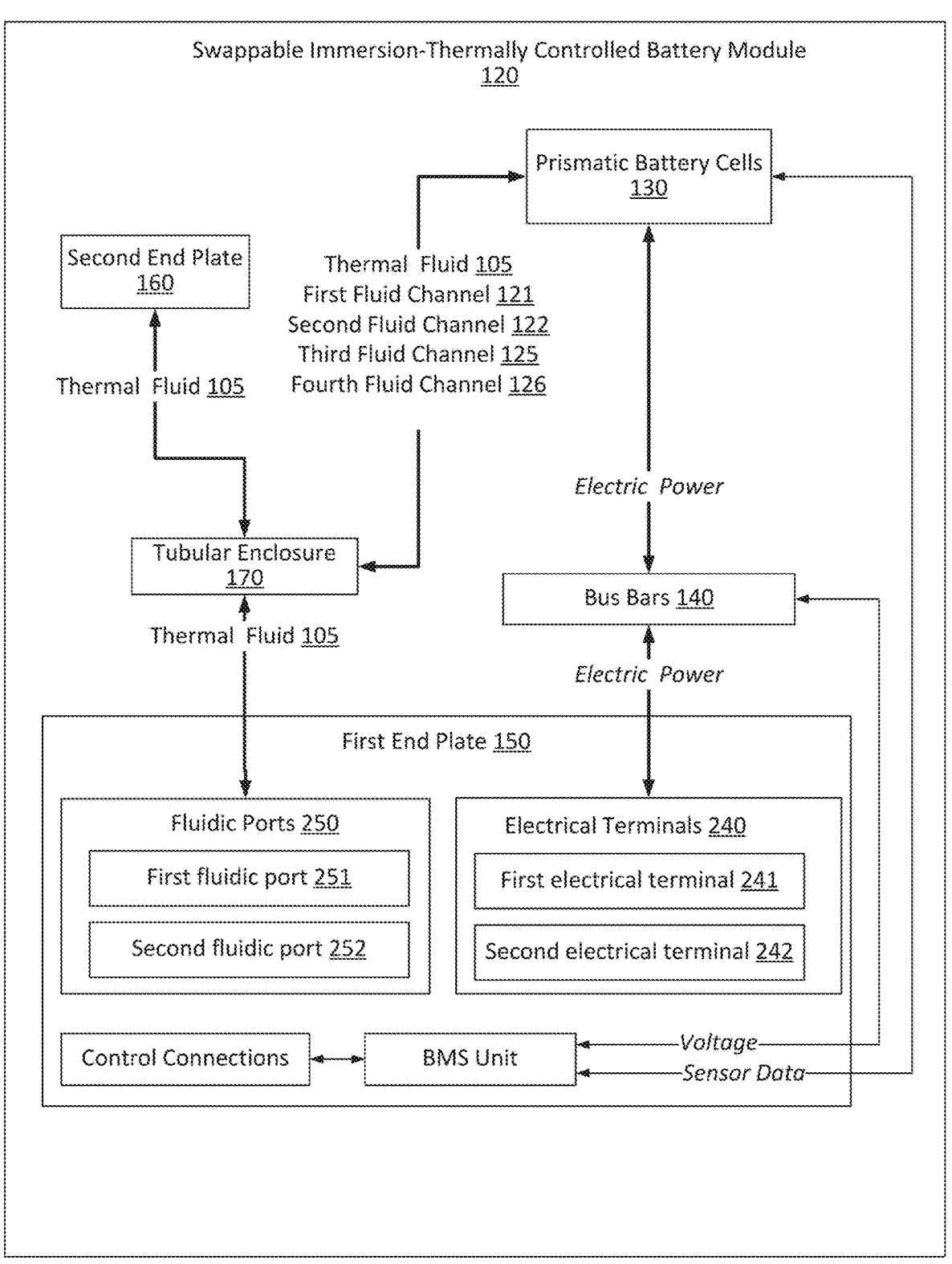
FIG. 2A is a block diagram of a swappable battery module, in accordance with some examples.
Figures 2B, 2C:
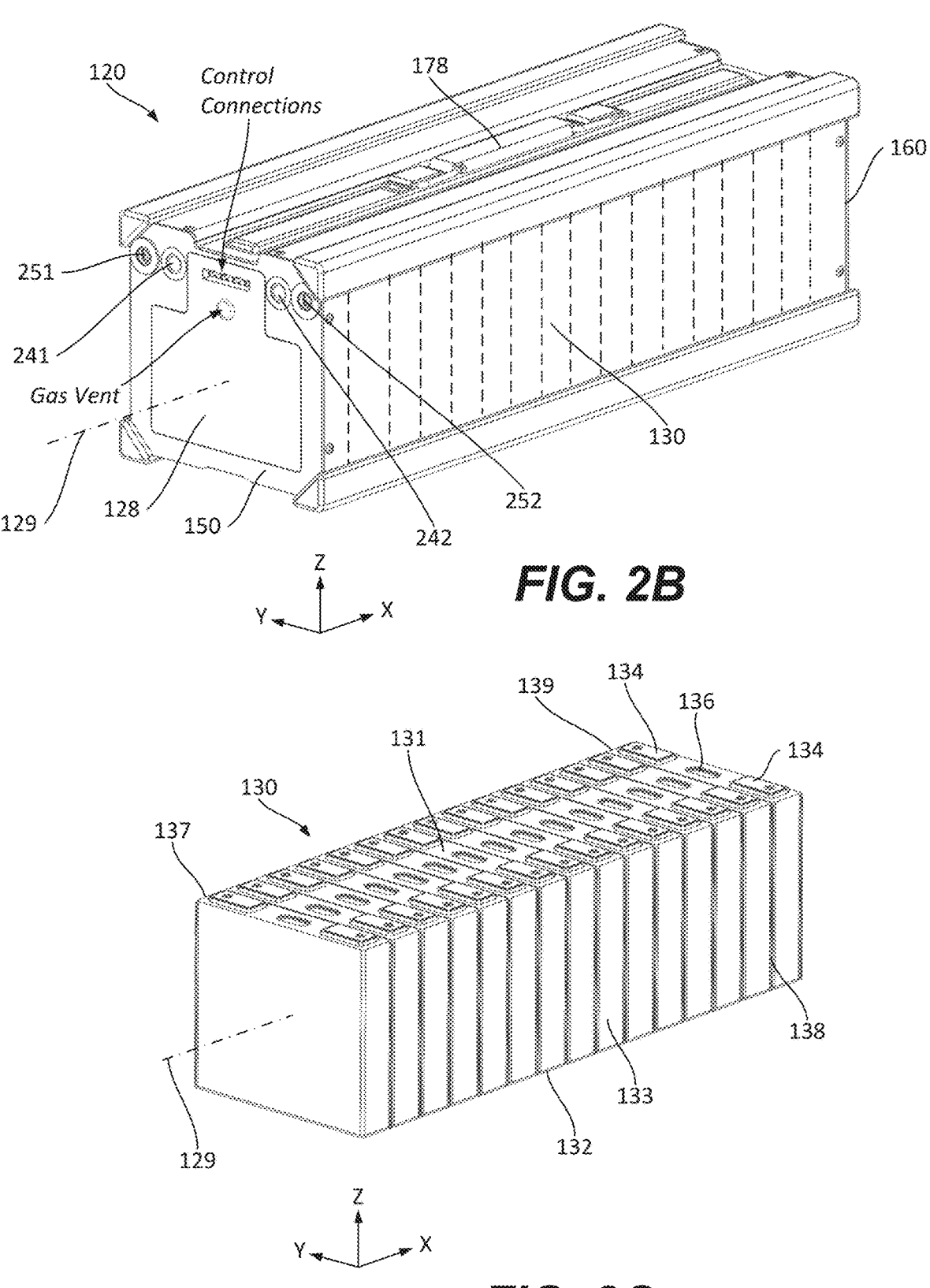
FIG. 2B is a schematic illustration of a swappable battery module comprising immersion-thermally controlled battery cells, in accordance with some examples.
FIG. 2C is a schematic perspective view of a stack of prismatic battery cells for use in a swappable battery module, in accordance with some examples.

Battery module 120 comprises electrical terminals 240 to form the above-referenced electrical connections. The same set of electrical terminals 240 is used for connection to both vehicle power system 102 and charger power system 182. Furthermore, battery module 120 comprises fluidic ports 250 to form the above-referenced fluidic connections, e.g., to at least one of vehicle thermal management system 110 and charger thermal management system 190. These and other features of battery module 120 will now be described with reference to FIGS. 2A-2L and FIG. 3A-3B.
Examples of Swappable Immersion-Thermally Controlled Battery Modules FIG. 2A is a block diagram of swappable battery module 120, illustrating various module components as well as mechanical and functional connections among these components, in accordance with some examples. FIG. 2B is a schematic perspective view of swappable battery module 120 in FIG. 2A. Battery module 120 comprises immersion-thermally controlled battery cells 130 forming one or more stacks inside battery module 120. Specifically, in the view of FIG. 2B, prismatic battery cells 130 (schematically identified using dashed lines) are hidden by other components such as tubular enclosure 170, first end plate 150, and second end plate 160. A combination of tubular enclosure 170, first end plate 150, and second end plate 160 enclose prismatic battery cells 130 and isolate prismatic battery cells 130 from the environment. Furthermore, this combination of tubular enclosure 170, first end plate 150, and second end plate 160 provide the immersion thermal control to prismatic battery cells 130 by containing thermal fluid 105 within various fluid channels formed by these components and prismatic battery cells 130 as further described below.

FIG. 2C is a schematic perspective view of a stack of prismatic battery cells 130, in accordance with some examples. Specifically, tubular enclosure 170, first end plate 150, and second end plate 160 are not shown in FIG. 2C. One having ordinary skill in the art would understand that any number of cells can be used in one battery module 120. Battery cells 130 used in battery module 120 are prismatic, rather than cylindrical. Prismatic battery cells 130 can be packed more compactly (with fewer spaces in between cells) within battery module 120 resulting in a higher density of battery module 120. For purposes of this description, a prismatic battery cell is defined as a cell having the shape of a rectangular prism (as opposed to a cylinder). As such, a prismatic battery cell has three distinct dimensions: (a) height, (b) width, and (c) thickness. In some examples, the height of prismatic battery cell 130 (used in battery module 120) is between 50 millimeters and 200 millimeters or, more specifically, between 75 millimeters and 125 millimeters. In the same or other examples, the width of prismatic battery cell 130 (used in battery module 120) is between 50 millimeters and 200 millimeters or, more specifically, between 75 millimeters and 125 millimeters. In some examples, the thickness of prismatic battery cell 130 (used in battery module 120) is between 5 millimeters and 50 millimeters or, more specifically, between 10 millimeters and 30 millimeters. The number and size of battery cells 130 also define the size and weight of battery module 120. In some examples, battery module 120 has a weight of between 5 kilograms and 50 kilograms or, more specifically, between 10 kilograms and 40 kilograms, such as between 15 kilograms and 30 kilograms. While a heavier module can provide more charge energy, it is much harder to handle and swap heavier modules. In general, the weight of battery module 120 is selected to be swappable by a human.

Prismatic battery cells 130 can be of various chemistry types, e.g., nickel-manganese-cobalt (NMC), lithium iron phosphate (LFP), and lithium titanate (LTO), at least based on the composition of positive electrodes. For example, lithium titanate (LTO) cells can support high charge-discharge rates, which may be particularly useful for industrial applications such as electric tractors, loaders, and the like.

Referring to FIGS. 2B and 2C, prismatic battery cells 130 are stacked along primary axis 129 of battery module 120 (which extends substantially parallel to the X-axis in these figures). While FIG. 2C illustrates one cell stack, the same battery module 120 may include multiple different cell stacks (e.g., positioned next to each other). Prismatic battery cells 130 comprise first surfaces 131, second surfaces 132 opposite to first surfaces 131, and side surfaces 133 extending between first surfaces 131 and second surfaces 132. For example, each first surface 131, second surface 132, and side surface 133 can be substantially parallel to primary axis 129. In some examples, each of prismatic battery cells 130 has a height, length, and thickness such that the thickness is less than the height and less than the length and such that the thickness is parallel to primary axis 129 of battery module 120. Prismatic battery cells 130 can be stacked along their thicknesses.

Prismatic battery cells 130 also comprise cell terminals 134 positioned on first surfaces 131. Cell terminals 134 are used to form electrical connections to prismatic battery cells 130. In some examples, cell terminals 134 are isolated from the other external components (e.g., the case, lid) of prismatic battery cells 130 such that these components are neutral. In some examples, prismatic battery cells 130 comprise pressure-release burst valves 136 configured to release gases from the interior of prismatic battery cells 130 when the pressure inside prismatic battery cells 130 exceeds a set threshold. In more specific examples, pressure-release burst valve 136 of each prismatic battery cell 130 is positioned between cell terminals 134 of that cell.

Figures 2D, 2E, 2F:
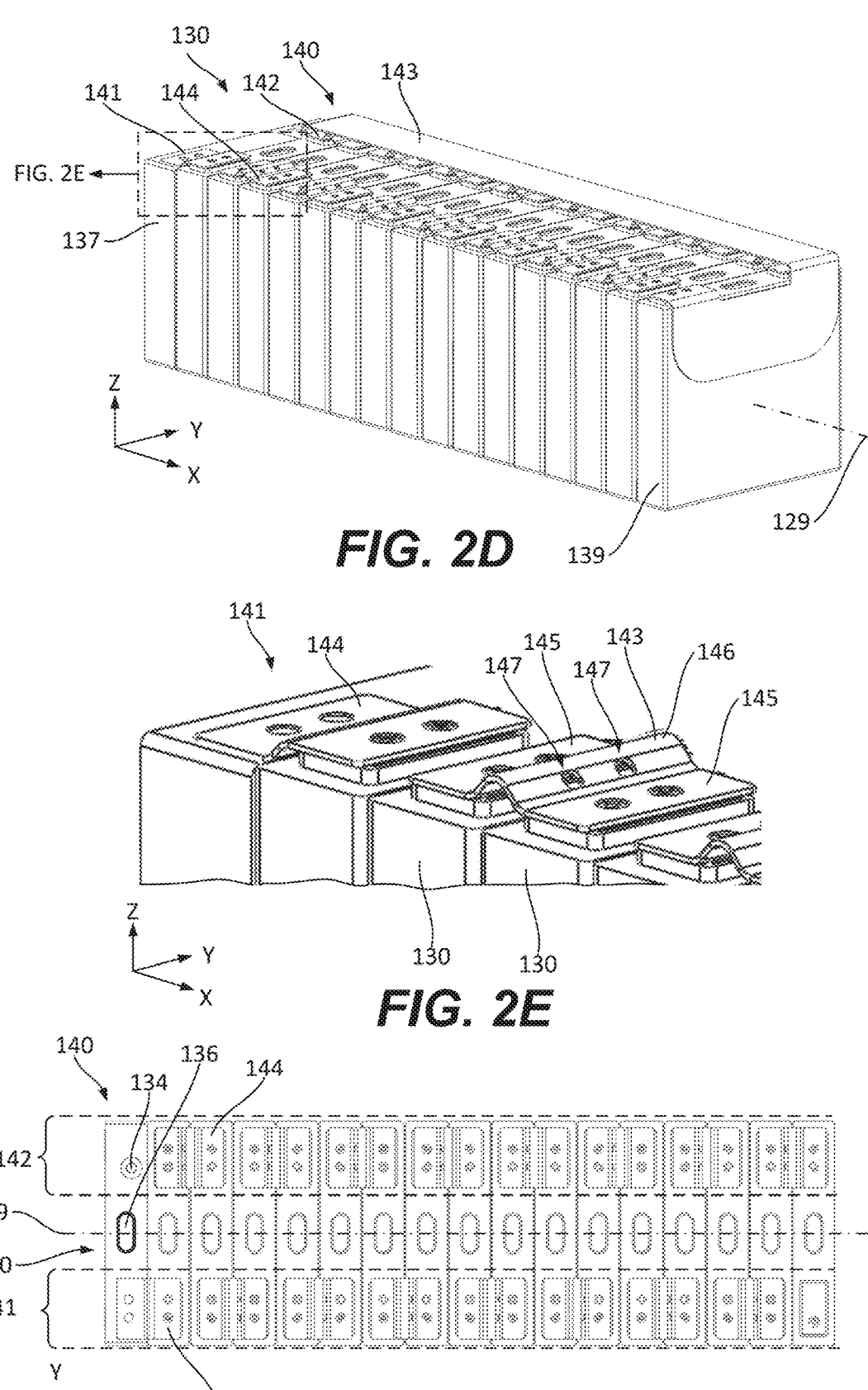
FIG. 2D is a schematic perspective view of the prismatic battery cells in FIG. 2C with three sets of bus bars attached to the cells, in accordance with some examples.
FIG. 2E is a schematic expanded view of FIG. 2D illustrating two disjoined bus bar components, in accordance with some examples.
FIG. 2F is a schematic top view of the prismatic battery cells in FIG. 2C with two sets of bus bars (and no return bus bar) attached to the cells, in accordance with some examples.
Figure 2G:
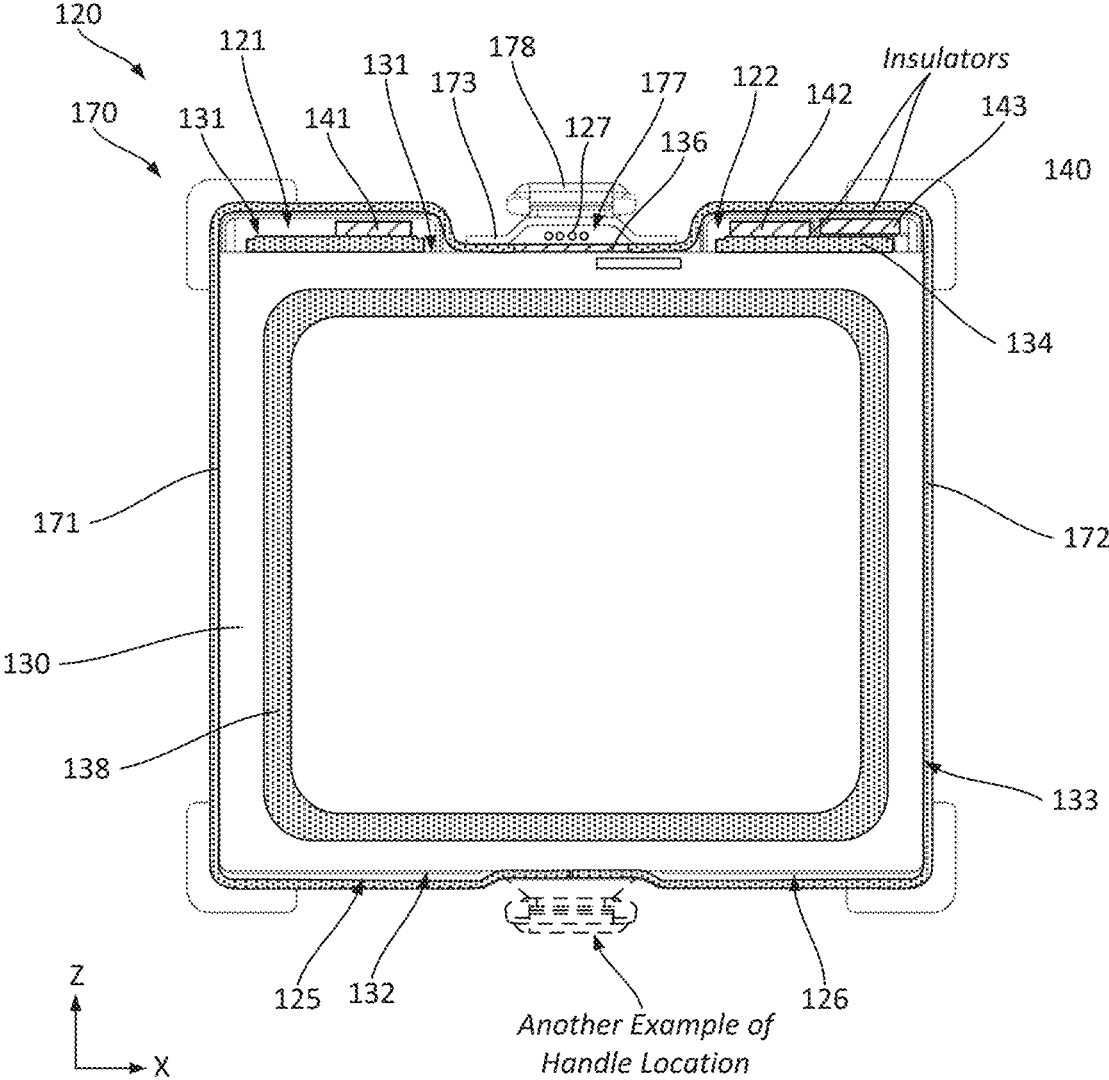
FIG. 2G is a schematic cross-sectional view of a swappable battery module illustrating fluidic channels formed by the tubular enclosure and cells, in accordance with some examples.
Figure 2H:
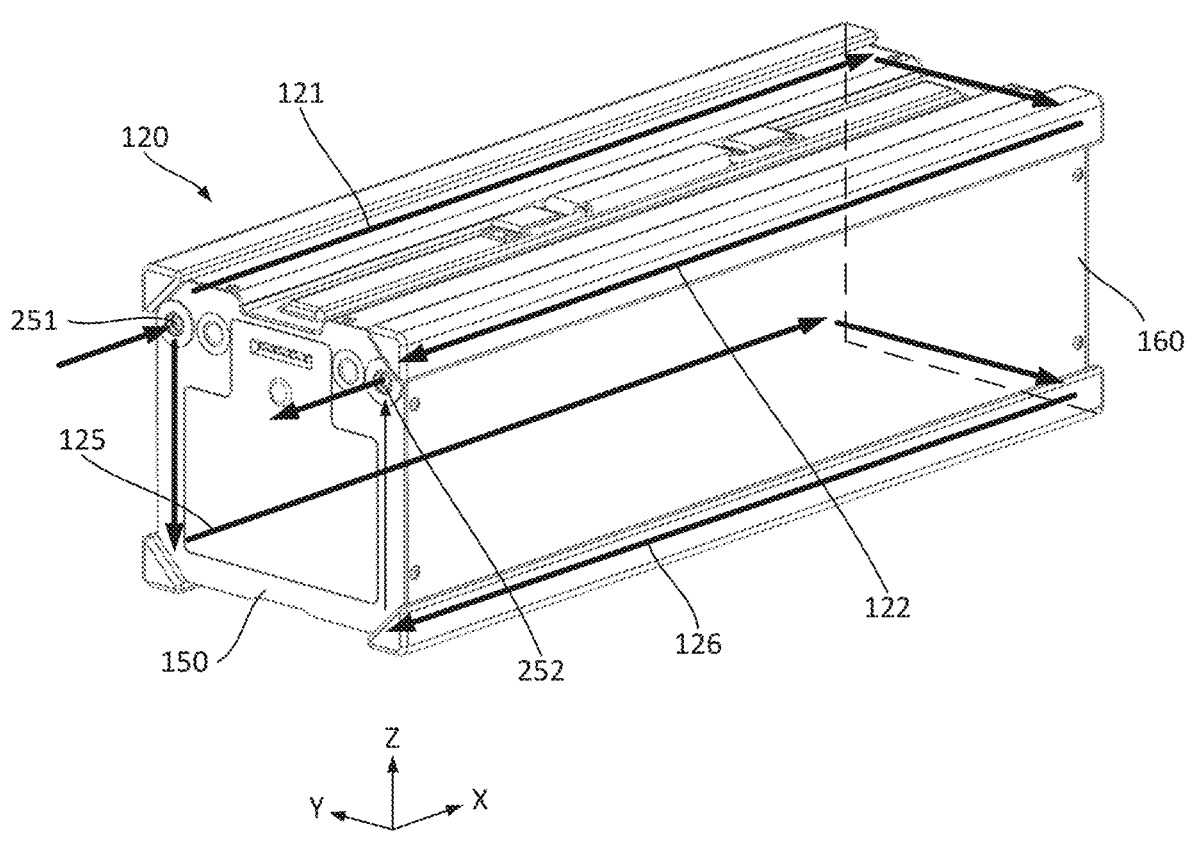
FIGS. 2H and 2I are schematic views of a swappable battery module illustrating fluidic pathways through the module, in accordance with some examples.
Figure 2I:
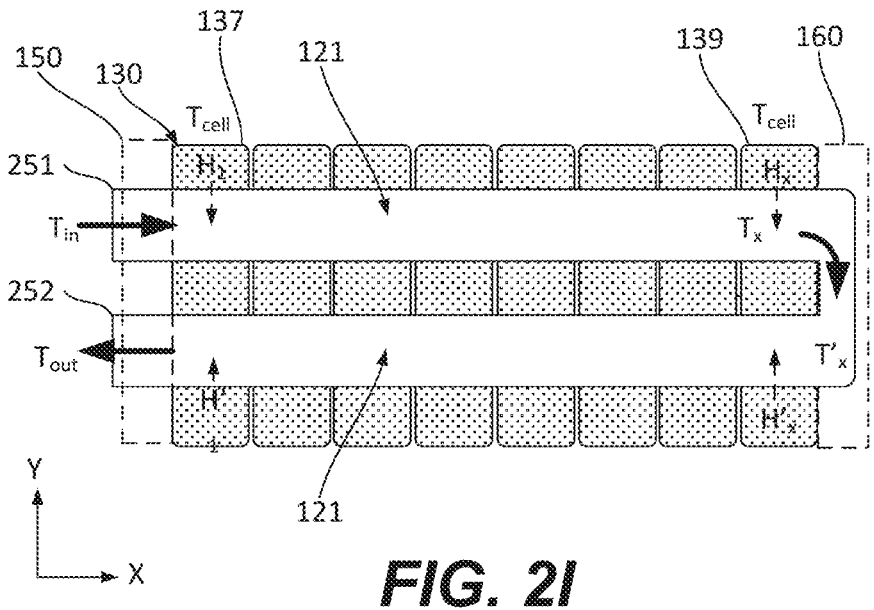

Referring to FIGS. 2C and 2I, in some examples, two adjacent prismatic battery cells 130 are mechanically interconnected by adhesive layer 138 extending between prismatic battery cells 130 in each adjacent pair. Some examples of adhesive layer 138 include but are not limited to epoxy and polyurethane. The thickness of adhesive layer 138 can be used to accommodate variations in the cell thicknesses. For example, a pair of thin cells may have a thicker adhesive layer, while a pair of thick cells may have a thinner adhesive layer, such that the combined thickness is the same regardless of the cell thicknesses. Furthermore, flexible adhesives can be compressible and used to accommodate cell swelling (if any) during the operation of battery module 120. In some examples, adhesive layers 138 also provide electrical insulations between adjacent cells (e.g., even though the sides of battery cells 130 can be substantially neutral). In these examples, adhesive layers 138 are continuous sheets extending between battery cells 130 to tubular enclosure 170. Alternatively, adhesive layers 138 have an annulus shape, e.g., as shown in FIG. 2I to accommodate swelling of prismatic battery cells 130 that tend to swell more in the center/away from the edges.

Adhesive layers 138 provide attachment/bonding between prismatic battery cells 130 in the set adding to the overall structural integrity of battery module 120. In other words, a combination of prismatic battery cells 130 and adhesive layers 138 is operable as an internal structural element (which can be referred to as a "skeleton") of battery module 120. Other components of battery module 120, e.g., first end plate 150, second end plate 160, and tubular enclosure 170 are operable as an internal structural element ("exoskeleton"). Furthermore, adhesive layers 138 provide electrical isolation and, in some examples, thermal isolation of adjacent prismatic battery cells 130. While the cases of prismatic battery cells 130 can be neutral, the electrical isolation can help to improve the overall module safety (e.g., when internal shorts develop in one or more prismatic battery cells 130).

Referring to FIGS. 2D-2E, battery module 120 comprises bus bars 140 interconnecting cell terminals 134. Bus bars 140 can be made from copper, aluminum, nickel, and other suitable conductive materials. While FIGS. 2D and 2F illustrate one example of cell connections (i.e., 17*s* connection scheme, in which each 17 prismatic battery cells 130 are interconnected in series), other examples are also within the scope. The connection scheme depends on the required voltage output of battery module 120 and other like factors.

In some examples, bus bars 140 comprise a plurality of disjoined components 144, forming first bus-bar row 141 and second bus-bar row 142, e.g., as shown in FIG. 2E where return bus bar 143 is not shown/hidden). Furthermore, bus bars 140 can include return bus bar 143, used for positioning both electric terminals of battery module 120 on the same side (e.g., first end plate 150). Return bus bar 143 can be connected to one cell (e.g., second-end cell 139 in FIG. 2D) and one electric terminal (not shown in FIG. 2D). Return bus bar 143 extends over battery cells 130 without making any other electrical connections to battery cells 130 or other components of bus bars 140.

Referring to FIG. 2E, in some examples, one example of disjoined components 144 comprises two planar portions 145 and interconnecting rib 146, joining two planar portions 145. Two planar portions 145 are connected to cell terminals 134 of two adjacent battery cells 130. Interconnecting rib 146 can protrude from two planar portions 145 and in the direction away from battery cells 130, e.g., to provide in-plane movement flexibility between planar portions 145 (e.g., along the X-axis to accommodate the swelling of adjacent battery cells 130 corresponding to changing the distance between the attachment points between these cells and planar portions 145. It should be noted that interconnecting rib 146 protrudes into a fluidic channel and can (at least partially) block the fluidic path. As such, interconnecting rib 146 comprises one or fluid path openings 147 to assist with this flow. Furthermore, interconnecting rib 146 can assist with the mixing of thermal fluid 105 within the channel thereby enhancing the thermal transfer characteristics.

Referring to FIG. 2F, bus bars 140 in first bus-bar row 141 are connected to cell terminals 134 having one polarity (e.g., positive cell terminals), while bus bars 140 in second bus-bar row 142 are connected to cell terminals 134 having the other polarity (e.g., negative cell terminals). Further connections are provided through battery cells 130. Since cell terminals 134 are positioned on first surfaces 131 (in the example shown in FIG. 4), bus bars 140 are also positioned next to first surfaces 131.

It should be noted that during the operation of battery module 120, bus bars 140 are immersion-thermally controlled as further described below. As such, the cross-section of bus bars 140 can be reduced in comparison to bus bars that are not thermally controlled thereby allowing some resistive heating within bus bars 140. For example, the temperature coefficient of copper is about $0.00404 \ C^{-1}$. Therefore, increasing the temperature of copper bus bars by 50° C. will cause the resistivity to increase by about 20%. Without the temperature control of bus bars 140, the dimensions of bus bars 140 need to accommodate the highest operating temperature. It should be noted that the heating of bus bars 140 can be caused by receiving the heat from battery cells 130 and also from the internal resistive heating. However, increasing the size of bus bars 140 (to accommodate for higher operating temperatures) is highly undesirable since this increases the weight and size of bus bars 140 (and as a result of battery module 120). Furthermore, bus bars 140 can be used (in addition to thermal fluid 105) for transferring the heat between battery cells 130.

Referring to FIG. 2G, tubular enclosure 170 is attached to each of first surfaces 131, second surfaces 132, and side surfaces 133 of prismatic battery cells 130. Tubular enclosure 170 forms first fluid channel 121 and second fluid channel 122 with a portion of first surfaces 131. Similarly, tubular enclosure 170 forms third fluid channel 125 and fourth fluid channel 126 with a portion of second surfaces 132. These fluid channels are used for circulating thermal fluid 105 through battery module 120 and, more specifically, for direct contact between thermal fluid 105 and prismatic battery cells 130 thereby establishing immersion thermal transfer between thermal fluid 105 and prismatic battery cells 130 (e.g., immersion cooling).

Overall, each prismatic battery cell 130 is immersed/comes in contact with the thermal fluid provided in all four fluid channels, i.e., first fluid channel 121, second fluid channel 122, third fluid channel 125, and fourth fluid channel 126. Each prismatic battery cell 130 is thermally controlled (e.g., immersion-cooled and/or immersion-heated) from first surface 131 and second surface 132 thereby ensuring more a uniform temperature profile within prismatic battery cell 130 (e.g., in comparison to one-sided cooling of battery cells). Furthermore, first fluid channel 121 and second fluid channel 122 are also used for cooling bus bars 140. For example, first bus-bar row 141 protrudes into first fluid channel 121 while second bus-bar row 142 protrudes into second fluid channel 122.

FIG. 2H illustrates one example of the fluidic flow paths within battery module 120. Specifically, first end plate 150 comprises first fluidic port 251 and second fluidic port 252. Thermal fluid 105 can enter battery module 120 through first fluidic port 251. First fluidic port 251 is fluidically coupled to both first fluid channel 121 and third fluid channel 125. Thereby, thermal fluid 105 is directed from first fluidic port 251 in both first fluid channel 121 and third fluid channel 125. When thermal fluid 105 flows through first fluid channel 121, thermal fluid 105 comes in contact with first surfaces 131 of battery cells 130 (or, more specifically, portions of these surfaces). Similarly, when thermal fluid 105 flows through third fluid channel 125, thermal fluid 105 comes in contact with second surfaces 131 of battery cells 130 (or, more specifically, portions of these surfaces). Once thermal fluid 105 reaches second end plate 160, a portion of thermal fluid 105 from first fluid channel 121 is redirected to second fluid channel 122, while the other portion of thermal fluid 105 from third fluid channel 125 is redirected to fourth fluid channel 126. As further described below, second end plate 160 fluidically interconnects first fluid channel 121 and third fluid channel 125. Second end plate 160 also fluidically interconnects second fluid channel 122 and fourth fluid channel 126 (independently from first fluid channel 121 and third fluid channel 125). Thermal fluid 105 then flows through second fluid channel 122 and again comes in contact with first surfaces 131 of battery cells 130 (now with different portions of these surfaces). Similarly, the other portion of thermal fluid 105 flows through fourth fluid channel 126 and comes in contact with second surfaces 131 of battery cells 130 (again with different portions of these surfaces). Second fluidic port 252 is fluidically coupled to both second fluid channel 122 and fourth fluid channel 126 and receives thermal fluid 105 from both of these channels, after which thermal fluid 105 is discharged from batter module 120 through second fluidic port 252.

Referring to FIG. 2I, as the thermal fluid having an inlet temperature ($T_{in}$) enters battery module 120, the thermal fluid receives the heat ($H_1$) and increases the fluid temperature as the fluid continues to flow through the module. For example, upon reaching the last cell in this series (second-end cell 139), the fluid temperature ($T_x$) will be higher than the inlet temperature ($T_x > T_{in}$). Assuming that all battery cells have the same temperature ($T_{cell}$), the first cell (first-end cell 137) that comes in contact with the immediately incoming (colder) fluid will lose more heat than any subsequent cell in this series since the heat transfer is proportional to the temperature gradient between the cell and the fluid. For example, the heat transfer from the last cell in this series ($H_x \propto T_{cell} - T_x$) will be smaller than the heat transfer from the first cell in this series ($H_1 \propto T_{cell} - T_{in}$) due to the thermal fluid heating and the thermal gradient reduction ($T_{in} < T_x \rightarrow H_1 > H_x$). If the thermal fluid is not looped and allowed to exit on the other side of the battery module, then the first cell will be cooled more than the last cell. However, when the thermal fluid is looped and has both first fluid channel 121 and second fluid channel 122 (both providing fluidic contact to each cell), there is additional heat transfer occurs from each cell. Specifically, the heat transfer provided by first fluid channel 121 is described above resulting in the first cell will be cooled more than the last cell. However, as the thermal fluid is directed from first fluid channel 121 to second fluid channel 122, the order of the cell experiencing the flow is flipped while the thermal fluid continues to heat. The last cell sees this return flow first and experiences additional heat transfer ($H'_x \propto T_{cell} - T'_x$). The first cell sees this return flow last and also experiences additional heat transfer ($H'_1 \propto T_{cell} - T_{out}$). Since the thermal fluid continues to heat ($T_{out} > T'_x$), the last cell is now cooled more ($H'_x > H'_1$). Combining the two heat transfers (provided by first fluid channel 121 to second fluid channel 122), the total heat transfer is more balanced ($H_x + H'_x \sim H_1 + H'_1$) than the heat transfer provided by each of the channels individually. While the above example is provided for cells' cooling, one having ordinary skill in the art would understand how the same concept applies to cells' heating.

Returning to FIG. 2G, first fluid channel 121 and third fluid channel 125 are formed by tubular enclosure 170 with a portion of first surfaces 131. Similarly, third fluid channel 125 and fourth fluid channel 126 are formed by tubular enclosure 170 with a portion of second surfaces 132. In this example, first bus-bar row 141 extends within first fluid channel 121. In other words, both first surfaces 131 of battery cells 130 and first bus-bar row 141 can be thermally controlled (e.g., cooled and/or heated) while thermal fluid 105 flows through third fluid channel 125. First bus-bar row 141 is connected to cell terminal 134. A portion of tubular enclosure 170 can be protected from contacting first bus-bar row 141 and cell terminal 134 by an insulator, thereby maintaining the electric neutrality of tubular enclosure 170. In this illustrated example, second bus-bar row 142 extends within second fluid channel 122. Furthermore, return bus bar 143 (if one is present) can extend through either first fluid channel 121 or second fluid channel 122. Return bus bar 143 may be operable as a return bus bar as described above.

Referring to FIG. 2G, in some examples, tubular enclosure 170 comprises first enclosure portion 171 and second enclosure portion 172, each independently attached to each of first surfaces 131, second surfaces 132, and side surfaces 133 of prismatic battery cells 130. Each of first enclosure portion 171 and second enclosure portion 172 is also independently attached to each of first end plate 150 and second end plate 160 (not shown in FIG. 2F). Each of first enclosure portion 171 and second enclosure portion 172 can be independent monolithic components (e.g., a shaped metal sheet). However, these portions are not monolithic with each other. Separating tubular enclosure 170 into first enclosure portion 171 and second enclosure portion 172 simplified the assembly of battery module 120, e.g., positioning battery cells 130 with tubular enclosure 170. In some examples, each of first enclosure portion 171 and second enclosure portion 172 is glued to each of first surfaces 131, second surfaces 132, and side surfaces 133 of prismatic battery cells 130. Similarly, each of first enclosure portion 171 and second enclosure portion 172 can be glued to each of first end plate 150 and second end plate 160.

Referring to FIG. 2G, in some examples, tubular enclosure 170 further comprises interconnecting portion 173, attached to each of first enclosure portion 171 and second enclosure portion 172 and forming gas-ventilation channel 177 with first surfaces 131 of prismatic battery cells 130. Interconnecting portion 173 effectively interconnects (bridges) first enclosure portion 171 and second enclosure portion 172 while extending above first surfaces 131 of prismatic battery cells 130. In some examples, interconnecting portion 173 is glued to each of first enclosure portion 171 and second enclosure portion 172. As noted above, prismatic battery cells 130 comprise pressure-release burst valves 136 positioned on first surfaces 131. These pressure-release burst valves 136 are in fluid communication with gas-ventilation channel 177.

In case one or more prismatic battery cells 130 experience internal over-pressurization, the corresponding pressure-release burst valves 136 open and release internal gases (and possibly other matter) from these cells into gas-venting channel 177 thereby allowing to depressurize the cells. In some examples, gas-venting channel 177 is fluidically isolated from other components, e.g., bus bars 140, thereby preventing further propagation of unsafe conditions and even potentially continuing the operation of battery module 120. In some examples, one or both of first end plate 150 and second end plate 160 comprise burst valves to vent gases from battery module 120 (e.g., when the pressure inside gas-venting channel 177 exceeds a set threshold).

In some examples, swappable battery module 120 further comprises sensor wires 127, functionally coupled to each of prismatic battery cells 130 and protruding within gas-ventilation channel 177 to first end plate 150. For example, sensor wires 127 can be coupled to cell terminals 134 and/or bus bar portions (e.g., used for voltage sensing) and/or to thermocouples and/or other sensors disposed inside battery module 120. Sensor wires 127 can extend to first end plate 150 for connecting to battery management system 128 and/or forming one or more external connections.

In some examples, battery module 120 comprises handle 178, e.g., for carrying battery module 120 between electric vehicle 100 and external charger 180. Handle 178 is coupled (e.g., glued) to tubular enclosure 170 or, more specifically, interconnecting portion 173, e.g., as shown in FIG. 2G. In other examples, handle 178 is coupled (e.g., glued) to the side of tubular enclosure 170, which is opposite of interconnecting portion 173/gas-ventilation channel 177. More specifically, handle 178 is coupled to the side of tubular enclosure 170 adjacent to second surfaces 132 of battery cells 130. In these examples, when battery module 120 is not fluidically coupled to either electric vehicle 100 or external charger 180, the residual thermal fluid 105 still occupies first fluid channel 121 and second fluid channel 122 thereby helping to maintain bus bars 140 inside this residual thermal fluid 105 (e.g., additional thermal mass and/or thermal conductivity to other pack components provided this by residual thermal fluid 105). It should be noted that the installation orientation (relative to the gravitational direction) of battery module 120 on electric vehicle 100 and external charger 180 is such that handle 178 faces up while the residual thermal fluid 105 will be at the bottom of battery module 120. It should be also noted that battery module 120 can also be used under some operating conditions (e.g., low currents) without being fluidically coupled and without circulating thermal fluid 105 inside battery module 120. In these examples, the residual thermal fluid 105 still assists with the heat dissipation with battery module 120. In some examples, another handle can be attached to second end plate 160 and is used during the installation of battery module 120 on electric vehicle 100 and external charger 180.

Figure 2J:
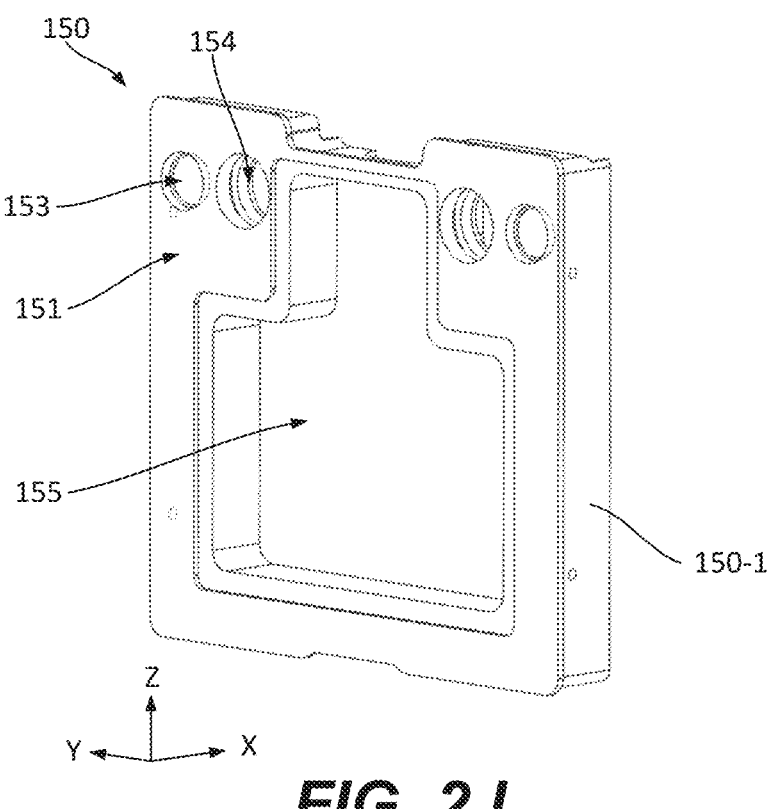
FIGS. 2J and 2K are schematic perspective front and back views of a first end plate, in accordance with some examples.
Figure 2K:
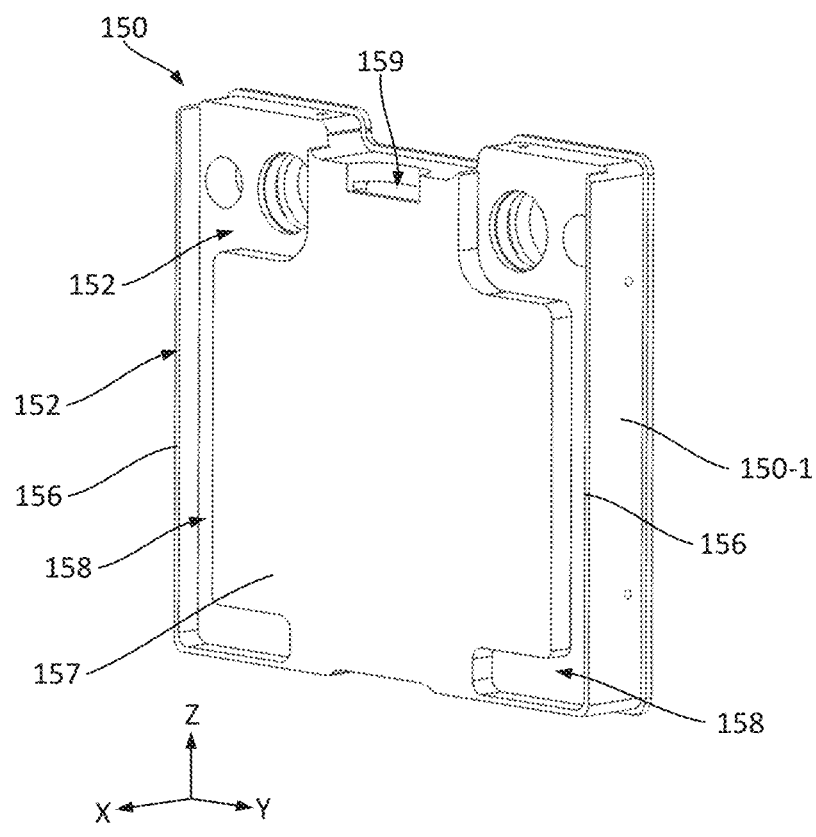

Referring to FIGS. 2J and 2K, in some examples, first end plate 150 comprises two electrical-terminal openings 153 (for installing first electrical terminal 241 and second electrical terminal 242—not shown in FIGS. 2J and 2K) and two fluid-port openings 154 (for installing first fluidic port 251 and second fluidic port 252—not shown in FIGS. 2J and 2K). Ins some examples, first fluidic port 251 and second fluidic port 252 are positioned further away from the side edges of first end plate 150 than the corresponding first electrical terminal 241 and second electrical terminal 242. Alternatively, first fluidic port 251 and second fluidic port 252 are positioned closer to the side edges of first end plate 150 than the corresponding first electrical terminal 241 and second electrical terminal 242.

In some examples, first end plate 150 comprises center protrusion 157 and two side edges 156. In battery module 120 side edges 156 extend along side surfaces 133 of first-end cell 137. Referring to FIG. 2K, two side edges 156 and center protrusion 157 from edge channels 158 fluidically coupling first fluid channel 121 and third fluid channel 125 and, separately, fluidically coupling second fluid channel 122 and fourth fluid channel 126.

Referring to FIG. 2J, in some examples, first end plate 150 comprises outer cavity 155 such that battery management system 128 is positioned with outer cavity 155 (e.g., as shown in FIG. 2B). First end plate 150 also comprises passthrough 159 such that sensor wires 127 protrude through passthrough 159 and are sealed within passthrough 159.

In some examples, first end plate 150 comprises side walls 150-1 extending between first-end-plate outer surface 151 and first-end-plate inner surface 152. At least a portion of these side walls 150-1 can extend into and can be attached (e.g., glued and sealed) to tubular enclosure 170. In some examples, fasteners are used for connecting first end plate 150 tubular enclosure 170. In some examples, first end plate 150 is also glued to first-end cell 137.

Figure 2L:
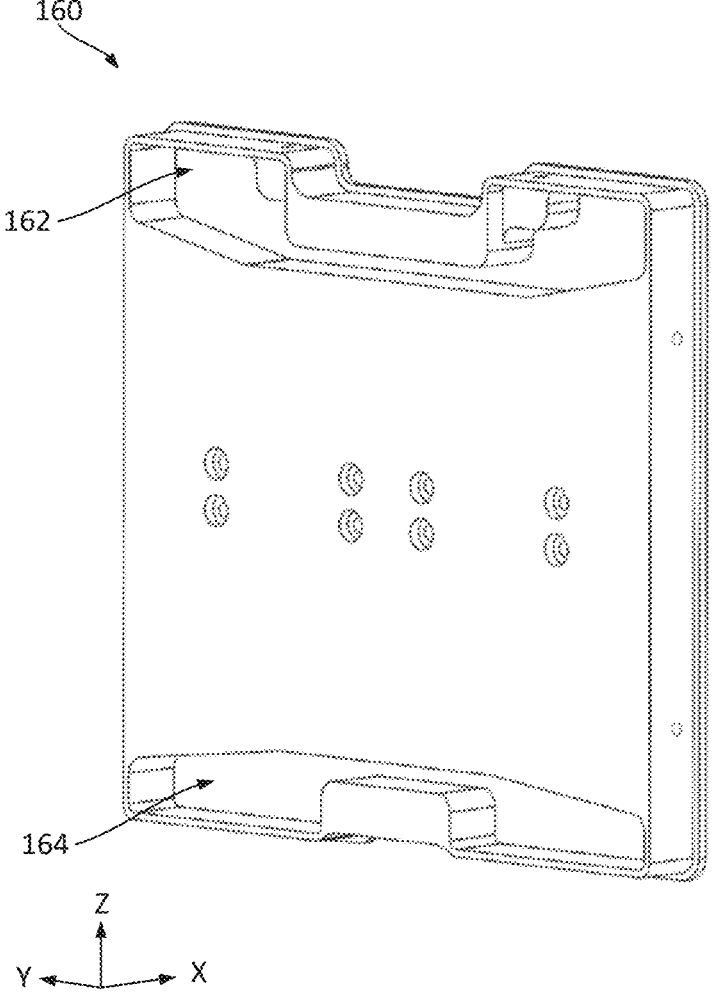
FIG. 2L is a schematic perspective view of a second end plate, in accordance with some examples.

Referring to FIG. 2L, in some examples, second end plate 160 comprises first cavity 162 fluidically coupling first fluid channel 121 and second fluid channel 122. Second cavity 164 fluidically couples third fluid channel 125 and fourth fluid channel 126. In battery assembly, second end plate 160 is attached to tubular enclosure 170, fluidically interconnecting first fluid channel 121 and third fluid channel 125, and fluidically interconnecting second fluid channel 122 and fourth fluid channel 126. For example, a portion of second end plate 160 protrudes into and is glued to tubular enclosure 170. In some examples, second end plate 160 is also glued to second-end cell 139.

Figure 3A:
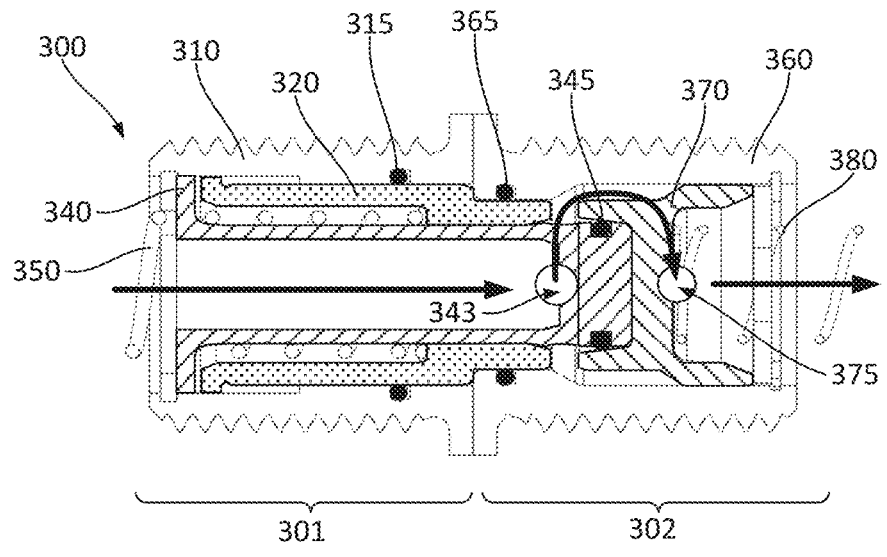
FIGS. 3A and 3B are schematic cross-sectional side views of a fluidic coupling comprising a first component and a second component, one of which can be operable as a fluidic port of a swappable battery module, in a coupled state (FIG. 3A) and a decoupled state (FIG. 3B) in accordance with some examples.
Figure 3B:
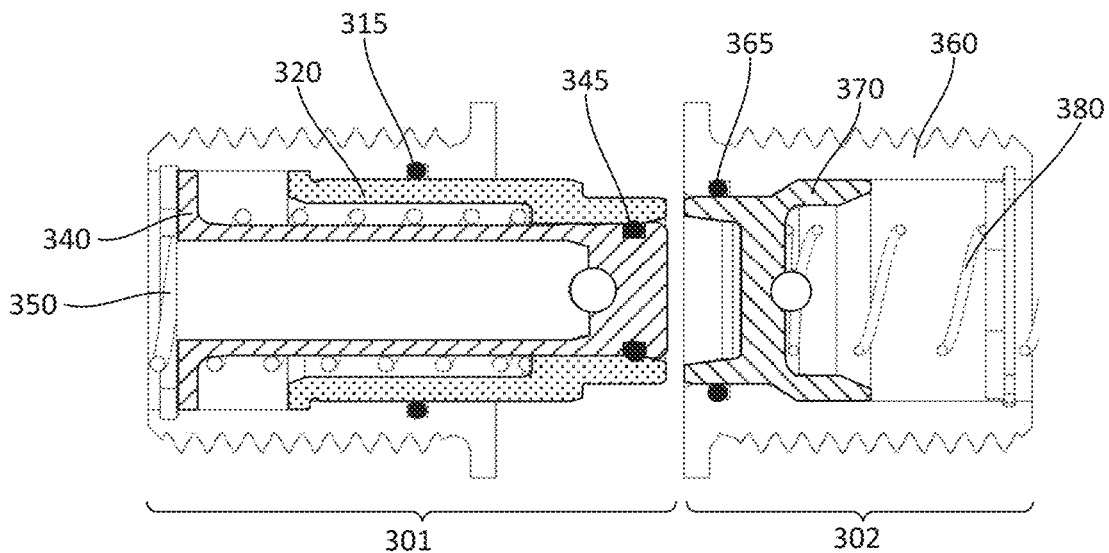

In some examples, each of first fluidic port 251 and second fluidic port 251 is configured to form fluidic coupling 300 with a corresponding fluidic port on one or both of electrical vehicle 100 and external charger 180. One example of fluidic coupling 300 is shown in FIGS. 3A and 3B. Specifically, fluidic coupling 300 comprises first component 301 and second component 302, configured to form a sealed fluidically coupling with each other in a coupled state (FIG. 3A) and to disconnect from each other while transitioning into a decoupled state (FIG. 3B). Either first component 301 or second component 302 can be operable as each of first fluidic port 251 and second fluidic port 251. When first component 301 is used as a fluidic port of battery module, second component 302 is used to connect to electric vehicle 100 and/or external charger 180. Alternatively, when second component 302 is used as a fluidic port of battery module 120, first component 301 is used to connect to electric vehicle 100 and/or external charger 180. It should be noted that second component 302 has a lower profile (no protrusions beyond its main body) thereby making second component 302 more suitable as a fluidic port of battery module 120

Referring to FIGS. 3A and 3B, first component 301 comprises first body 310, first spool 320, first spool seal 325, slider 340, first slider seal 345, and first spring 350. First spool 320 is slidably coupled to first body 310 and also to slider 340. First spool 320 is also biased, relative to first body 310, by first spring 350 (e.g., in the direction of second component 302). First spool 320 is sealed against first body 360 by second seal 365, which allows first spool 320 to slide relative to first body 360.

Second component 302 comprises second body 360, second seal 365, second spool 370, and second spring 380. Second spool 370 is slidably coupled to and biased, by second spring 380, relative to second body 360. Specifically, second spool 370 is biased in the direction of first component 301.

When fluidic coupling 300 is in the coupled state, e.g., as shown in FIG. 3A, first spool 320 extends into second body 360 and is sealed against second body 360 by second seal 365. At the same time, first spool 320 is sufficiently retracted into first body 310 allowing slider 340 to extend past first spool 320 and into second body 360. Slider 340 comprises slider opening 343 which allows thermal fluid 105 to flow from between the cavity inside slider 340 and the space between slider 340 and second body 360. Thermal fluid 105 can also flow through second-spool opening 375 between this space and the cavity of second spool 370. In other words, in this state, a fluidic pathway is provided between the cavity inside slider 340 and the cavity of second spool 370 thereby allowing the flow of thermal fluid 105 through fluidic coupling 300. At the same time, first spool 320 remains sealed against first body 310 by first seal 315 also against second body 360 by second seal 365 thereby sealing the interface between first body 310 and second body 360.

When fluidic coupling 300 is in the decoupled state, e.g., as shown in FIG. 3B, first spool 320 is sealed relative to slider 340 by first slider seal 345 thereby blocking the flow of thermal fluid 105 from first component 301. First spool 320 remains sealed against first body 310 by first seal 315. Furthermore, second spool 370 is sealed relative to second body 360 by second seal 365 thereby blocking the flow of thermal fluid 105 from second component 302. The transition between the coupled state and decoupled state is described below with reference to FIG. 4 and FIGS. 5A-5F below.

Examples of Methods of Operating Battery Modules

FIG. 4 is a process flowchart corresponding to method 400 of operating battery module 120, in accordance with some examples. Method 400 may commence with (block 410) installing battery module 120 on electric vehicle 100. For example, electric vehicle 100 can include a bay for receiving battery module 120. During this installation operation, battery module 120 forms an electrical connection with electric vehicle 100 using first electrical terminal 241 and second electrical terminal 242. For example, electric vehicle 100 can include corresponding terminals configured to connect with first electrical terminal 241 and second electrical terminal 242. In some examples, battery module 120 forms a mechanical connection with electric vehicle 100 (e.g., locked using a latching mechanism). Furthermore, in some examples, installing battery module 120 on electric vehicle 100 comprises (block 412) forming a fluidic coupling between battery module 120 and electric vehicle 100, e.g., using first fluidic port 251 and second fluidic port 252 of battery module 120. One example of such coupling is shown and described above with reference to FIGS. 3A and 3B. Additional features are described below with reference to FIGS. 5A-5F below. This fluidic coupling is optional, and, in some examples, battery module 120 is not fluidically connected to electric vehicle 100.

Method 400 may proceed with (block 420) operating electric vehicle 100, e.g., by powering electric vehicle 100 from battery module 120. As a result, battery module 120 is discharged during this operation. It should be noted that, in some examples, battery module 120 may be also charged onboard electric vehicle 100. In some examples (when battery module 120 is fluidically connected to electric vehicle 100), operating electric vehicle 100 may comprise (block 422) circulating thermal fluid 105 through battery module 120. For example, electric vehicle 100 may include vehicle thermal management system 110, which is designed to condition the temperature of thermal fluid 105 (e.g., by heating and/or cooling thermal fluid 105) and to pump thermal fluid 105 through battery module 120. In some examples, battery module 120 and electric vehicle 100 can be communicatively coupled during this operation. For example, battery module 120 can measure the internal cell temperature and send this information to vehicle thermal management system 110.

Method 400 may proceed with (block 430) removing battery module 120 from electric vehicle 100. This operation may be the reverse of the installation operation (block 410) described above. During the module removal operation, the electrical connection between battery module 120 and electric vehicle 100 is separated (e.g., by disconnecting first electrical terminal 241 and second electrical terminal 242 from the corresponding terminals on electric vehicle 100). In some examples (when battery module 120 is fluidically connected to electric vehicle 100), the battery removal operation (block 430) also comprises (block 432) disconnecting the fluidic coupling between battery module 120 and electric vehicle 100 as will now be described with reference to FIGS. 5A-5F.

Specifically, FIG. 5A illustrates fluidic coupling 300 is in the coupled state, which is described above with reference to FIG. 3A. FIG. 5B illustrates the first step in this disconnecting operation where first body 310 is moved away from second body 360. First spool 320 is biased by first spring 350, which pushes first spool 320 out of first body 310. At this step, second body 360 is operable as a positive stop for first spool 320. In fact, second body 360 is operable as a positive stop for first spool 320 during the coupled state in FIG. 5A and the next/second step in FIG. 5C. Referring to FIG. 5B, slider 340 follows first body 310 and is retracted into first spool 320. At this step, first slider seal 345 is not contacting/sealed against first spool 320 thereby allowing thermal fluid 105 to flow (through slider opening 343) between the cavity inside slider 340 and the space between slider 340 and second body 360. At the same time, as slider 340 follows first body 310 and is retracted into first spool 320, second spool 370 is biased toward first spool 320. FIG. 5B illustrates a point where second spool 370 reaches and contacts first spool 320. From this point on, first spool 320 is operable as a positive stop for second spool 370, at least through the few steps described below. In the coupled state of FIG. 5A, slider 340 acted as a positive stop for second spool 370. This spool contact can restrict the flow of thermal fluid 105 (in comparison to the coupled state of FIG. 5A) but does not fully seal the flow.

FIG. 5C illustrates the second step in this disconnecting operation where first body 310 is moved further away from second body 360 (in comparison to the first step of FIG. 5B). Slider 340 follows first body 310 and is retracted into first spool 320. However, at this step, first slider seal 345 is sealed against first spool 320 thereby preventing thermal fluid 105 from flowing between the cavity inside slider 340 and the space between slider 340 and second body 360. First spool 320 continues being pushed out of first body 310 by first spring 350 with second body 360 still operable as a positive stop.

Figure 5D:
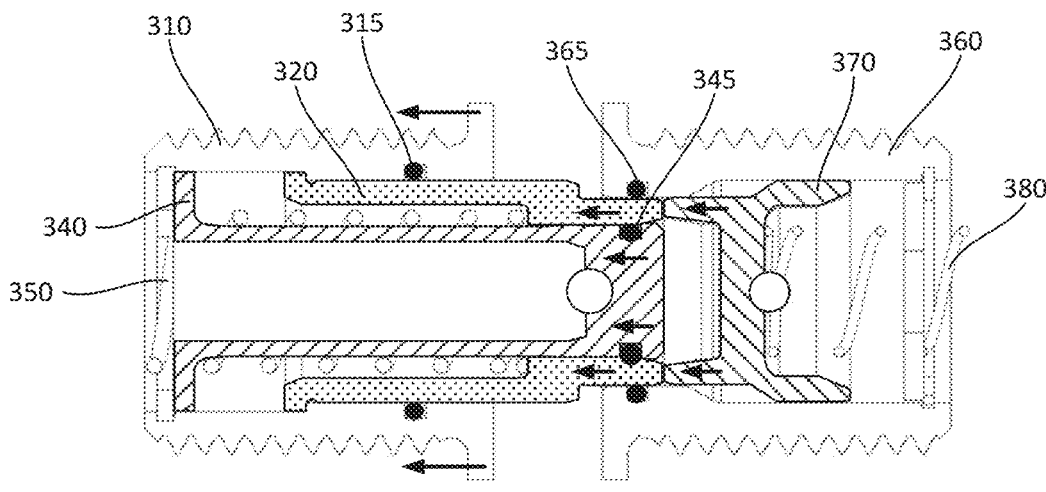

FIG. 5D illustrates the third step in this disconnecting operation where first body 310 is moved further away from second body 360 (in comparison to the second step of FIG. 5C). First slider seal 345 remains sealed against first spool 320 thereby preventing the flow of thermal fluid 105. First spool 320 is no longer being pushed out of first body 310 since a feature of first body 310 is now operable as a positive stop for first spool 320. As such, first spool 320 is now being extracted from second body 360. However, second seal 365 still seals against first spool 320 at this stage.

Figure 5E:
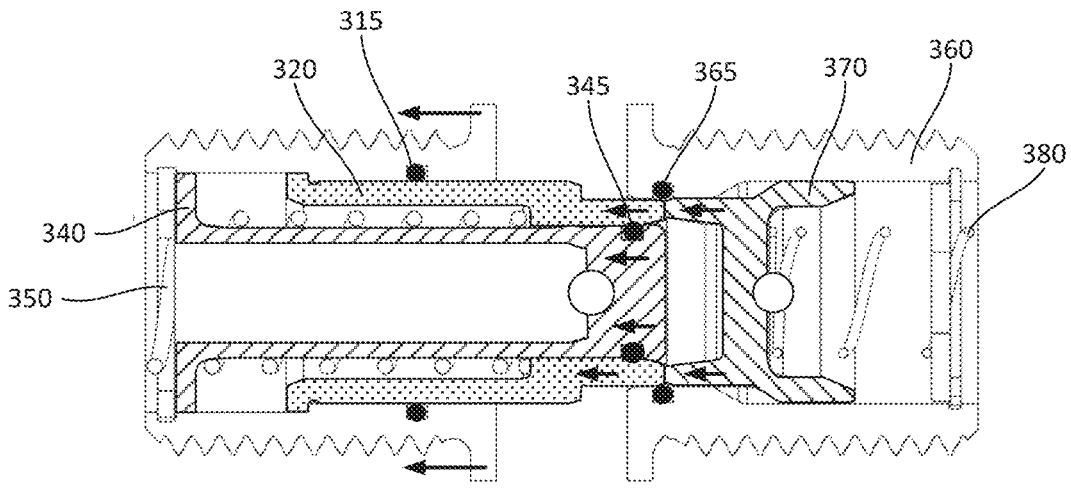

FIG. 5E illustrates the fourth step in this disconnecting operation where first body 310 is moved further away from second body 360 (in comparison to the second step of FIG. 5D). First slider seal 345 remains sealed against first spool 320 thereby preventing the flow of thermal fluid 105. First spool 320 continues being extracted from second body 360. The specific point (shown in FIG. 5E) can be referred to as the "second seal handoff" where second seal 365 disengages first spool 320 and engages second spool 370, which follows the travel of first spool 320.

Figure 5F:
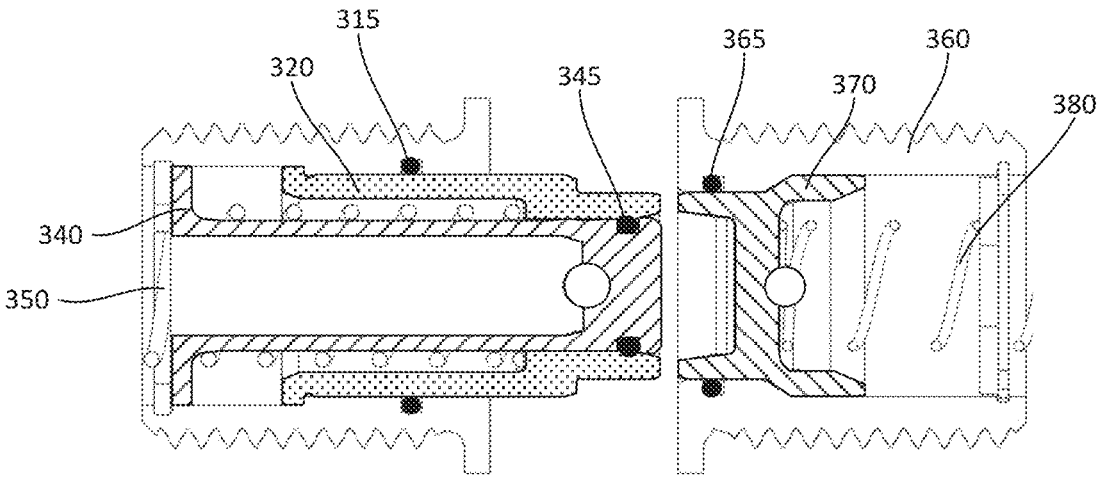

Finally, FIG. 5F illustrates the decoupled state where first body 310 is moved even further away from second body 360 (in comparison to the second step of FIG. 5E). This decoupled state is described above with reference to FIG. 3B.

Returning to FIG. 4, method 400 may proceed with (block 440) installing battery module 120 on external charger 180. For example, this installation operation may comprise (block 441) positioning swappable battery module 120 on external charger 180 comprising charger fluidic ports 183. One example of external charger 180 is shown in FIGS. 6A-6E. It should be noted that a module connection on electric vehicle 100 may be configured in a similar manner and include the same components.

Figure 6A:
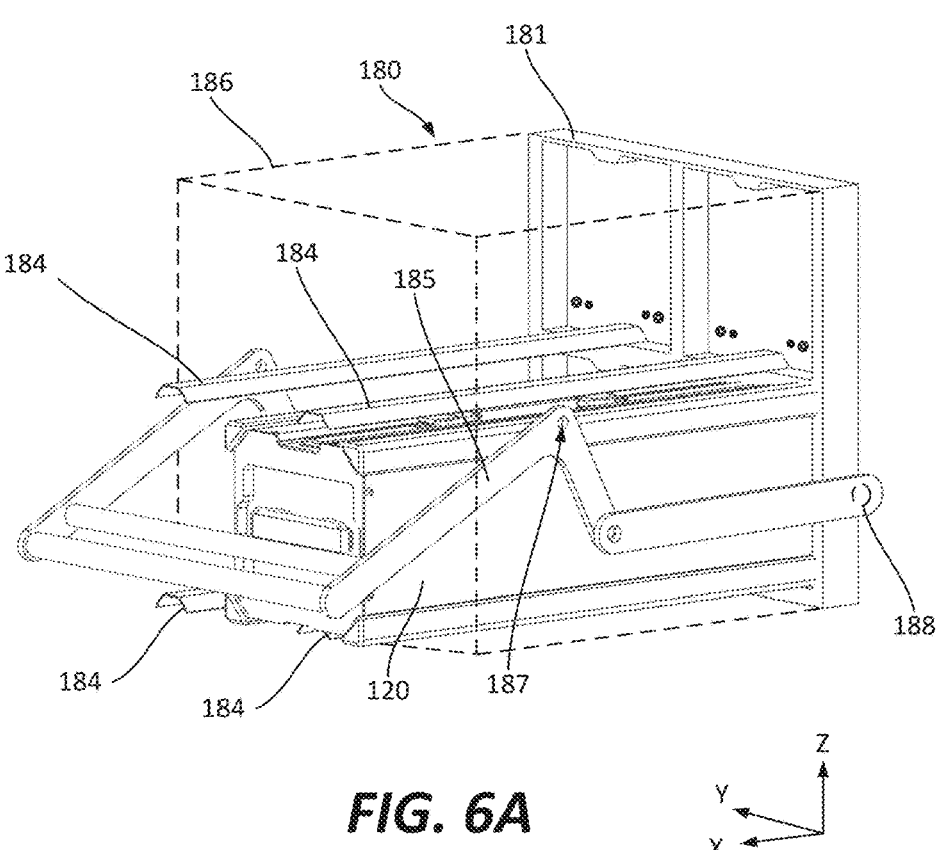
FIGS. 6A and 6B are schematic views of an external charger and one battery module connected to the charger, in accordance with some examples.
Figure 6B:
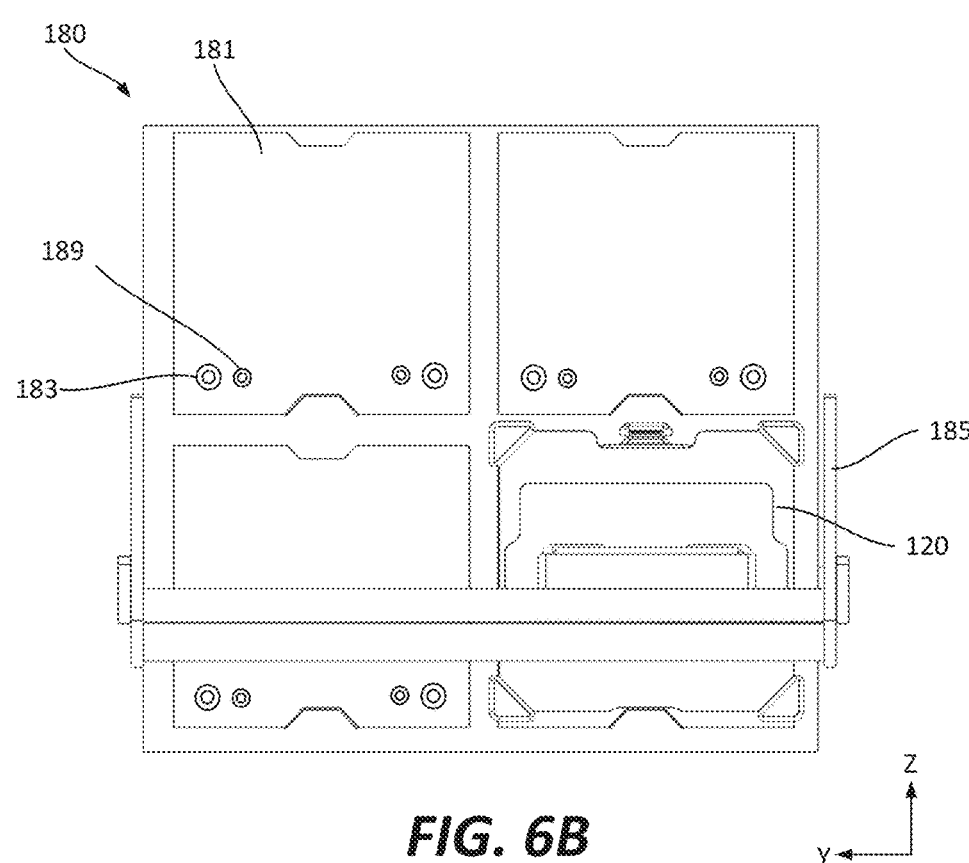

FIGS. 6A and 6B illustrate external charger 180 suitable for connecting to four battery modules 120. However, only one battery module 120 is shown in these views. External charger 180 comprises charger base 181, providing four module bays (one for each battery module 120). Each module bay comprises module support rail 184, two charger fluid ports 183, and two charger electric terminals 189. Module support rail 184 is configured to support battery module 120 and allow battery module 120 to slide in and out of the module bay while forming electric and fluid connections with external charger 180. Two charger fluid ports 183 are aligned (e.g., concentrically aligned) with corresponding fluid ports 250 of battery module 120 while battery module 120 is positioned on module support rail 184.

Each module bay also comprises limiting arm 185 pivotably coupled (at pivot point 187) to charger enclosure 186. Limiting arm 185 comprises limiting bar 188 positioned on the arm end proximate to charger base 181. Pivoting the limiting arm 185 changes the distance between limiting bar 188 and charger base 181 as will now be described with reference to reference to FIGS. 6C-6E.

Method 400 may proceed with (block 430) sliding first end plate 150 of battery module 120 toward charger fluidic ports 183 until charger fluidic ports 183 are fluidically coupled with first fluidic port 251 and second fluidic port 252. In other words, this sliding operation also comprises (block 442) connecting the fluidic coupling or, more specifically, connecting fluidic ports 250 of battery module 120 with charger fluidic ports 183.

Figures 6C, 6D, 6E:
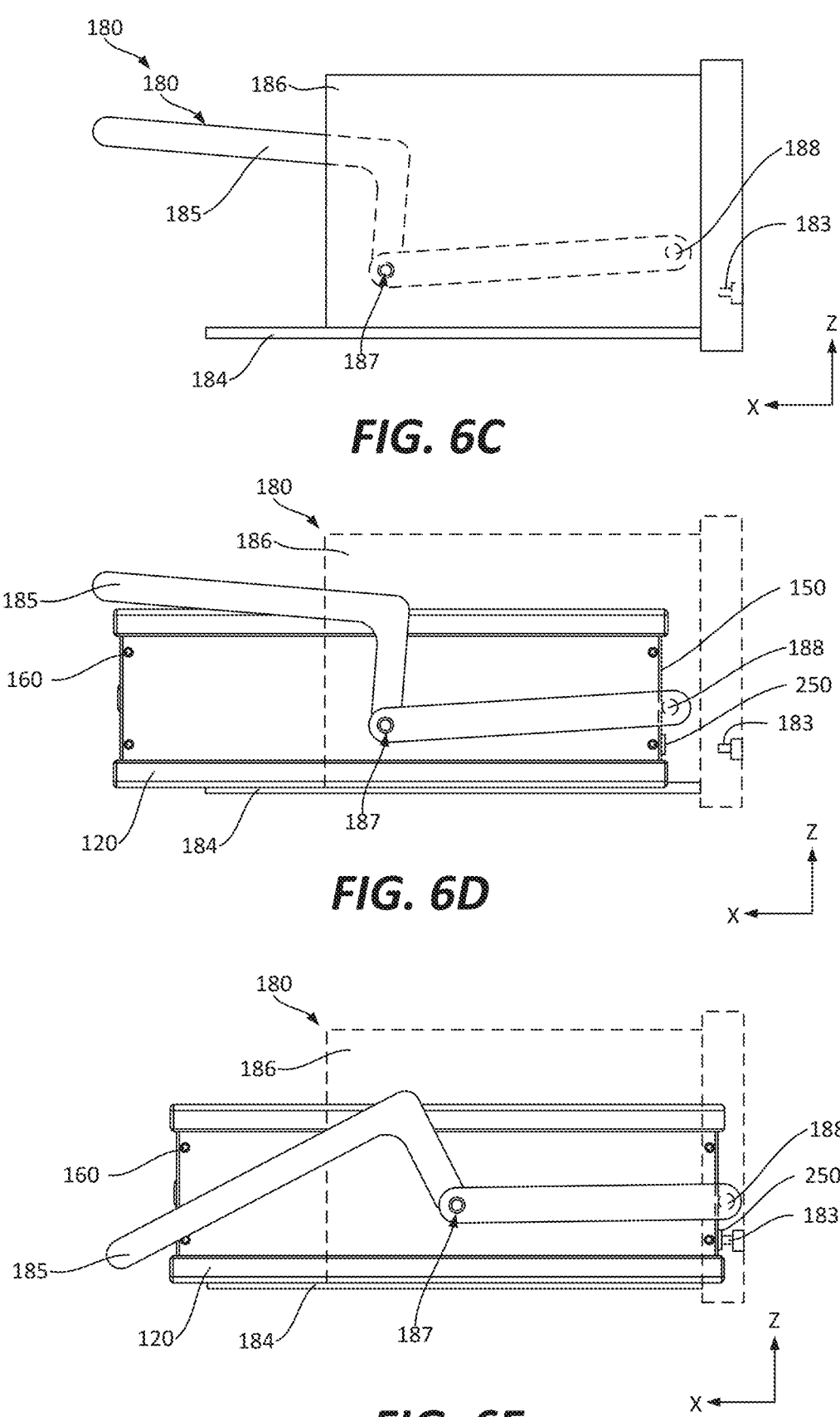
FIGS. 6C-6E are schematic side views of an external charger at various stages while connecting a battery module to the charger, in accordance with some examples.

FIG. 6C is a schematic side view of external charger 180 without battery module 120, in which limiting arm 185/limiting bar 188 is in the first position (further away from charger base 181). As battery module 120 slides on support rail 184 toward charger base 181, battery module 120 first contacts limiting bar 188 (e.g., as shown in FIG. 6D) that prevents battery module 120 from hitting charger base 181 and, more specifically, prevents corresponding fluid ports 250 of battery module 120 from hitting charger fluid ports 183 and, also, corresponding electric terminals 240 of battery module 120 from hitting charger electric terminals 189. It should be noted that battery module 120 is quite heavy and can carry significant momentum while sliding on support rail 184. It should be also noted that limiting bar 188 is positioned such that neither fluid ports 250 nor electric terminals 240 contact limiting bar 188 during this stage.

FIG. 6E is a schematic side view of external charger 180 with limiting arm 185/limiting bar 188 being in the position (closer to charger base 181). As limiting bar 188 transitions from the first position (in FIG. 6D) to the second position (in FIG. 6E), battery module 120 is allowed to get closer to charger base 181 and form the electric and fluidic coupling with external charger 180.

Method 400 may proceed with (block 450) charging battery module 120 on external charger 180. As a result, battery module 120 is charged during this operation. In some examples (when battery module 120 is fluidically connected to external charger 180), this charging operation may comprise (block 452) circulating thermal fluid 105 through battery module 120. For example, external charger 180 may include charger thermal management system 190, which is designed to condition the temperature of thermal fluid 105 (e.g., by heating and/or cooling thermal fluid 105) and to pump thermal fluid 105 through battery module 120. In some examples, battery module 120 and external charger 180 can be communicatively coupled during this operation. For example, battery module 120 can measure the internal cell temperature and send this information to charger thermal management system 190.

Method 400 may proceed with (block 460) removing battery module 120 from external charger 180. This operation may be the reverse of the installation operation (block 440) described above. During the module removal operation, the electrical connection between battery module 120 and external charger 180 is separated (e.g., by disconnecting first electrical terminal 241 and second electrical terminal 242 from the corresponding terminals on electric vehicle 100). In some examples (when battery module 120 is fluidically connected to external charger 180), the battery removal operation (block 460) also comprises (block 462) disconnecting the fluidic coupling between battery module 120 and external charger 180 in a manner similar to the one described above with reference to FIGS. 5A-5F.

CONCLUSION

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present examples are to be considered illustrative and not restrictive.

The invention claimed is:

1. A method of operating a swappable battery module, the method comprising:

positioning the swappable battery module on an external charger comprising charger fluidic ports, wherein:

the swappable battery module comprises prismatic battery cells, a tubular enclosure, attached to and enclosing the prismatic battery cells, a first end plate attached to the tubular enclosure, and a second end plate attached to the tubular enclosure, the tubular enclosure forms a first fluid channel, a second fluid channel, a third fluid channel, and a fourth fluid channel with the prismatic battery cells, the first end plate comprises a first fluidic port, fluidically coupled to both the first fluid channel and the third fluid channel, and a second fluidic port, fluidically coupled to both the second fluid channel and the fourth fluid channel, and the second end plate fluidically interconnects the first fluid channel and the third fluid channel and, separately, fluidically interconnects the second fluid channel and the fourth fluid channel;

sliding the first end plate toward the charger fluidic ports until the charger fluidic ports are fluidically coupled with the first fluidic port and the second fluidic port forming two fluidic couplings, wherein:

the external charger comprises a charger base and a charger enclosure forming a set of module bays, each module bay in the set of module bays comprises a module support rail, and the module support rail supports the swappable battery module when the swappable battery module is positioned on the external charger and slid toward the charger fluidic ports; and charging the swappable battery module using the external charger while circulating a thermal fluid through the swappable battery module through the charger fluidic ports, the first fluidic port, and the second fluidic port thereby establishing direct contact between the thermal fluid and the prismatic battery cells resulting in immersion thermal transfer between the thermal fluid and the prismatic battery cells.

2. The method of claim 1, wherein the thermal fluid is a transformer oil.

3. The method of claim 1, wherein the external charger comprises a charger thermal management system for conditioning a temperature of the thermal fluid and pumping the thermal fluid through the swappable battery module.

4. The method of claim 3, wherein the swappable battery module and the external charger are communicatively coupled while charging the swappable battery module using the external charger.

5. The method of claim 4, further comprising measuring a temperature of the prismatic battery cells and transmitting the temperature of the prismatic battery cells to the charger thermal management system, wherein the charger thermal management system is controlled using the temperature of the prismatic battery cells.

6. The method of claim 1, wherein the first fluidic port and the second fluidic port are sealed prior to sliding the first end plate toward the charger fluidic ports and contacting the first fluidic port and the second fluidic port with the charger fluidic ports.

7. The method of claim 6, wherein the first fluidic port and the second fluidic port are opened upon contacting the first fluidic port and the second fluidic port with the charger fluidic ports.

8. The method of claim 1, wherein:

a portion of the first end plate protrudes into and is glued to the tubular enclosure; and a portion of the second end plate protrudes into and is glued to the tubular enclosure.

9. The method of claim 1, wherein:

the first end plate is glued to a first-end cell of the prismatic battery cells; and the second end plate is glued to a second-end cell of the prismatic battery cells.

10. The method of claim 1, wherein:

the prismatic battery cells comprise first surfaces, second surfaces opposite to the first surfaces, and cell terminals positioned on the first surfaces, the swappable battery module comprises bus bars forming at least a first bus-bar row and a second bus-bar row and interconnecting the cell terminals, the tubular enclosure forms the first fluid channel and the second fluid channel with a portion of the first surfaces such that the first bus-bar row extends within the first fluid channel while the second bus-bar row extends within the second fluid channel the tubular enclosure further forms the third fluid channel and the fourth fluid channel with a portion of the second surfaces.

11. The method of claim 10, wherein:

the prismatic battery cells comprise side surfaces extending between the first surfaces and the second surfaces, the first end plate comprises a center protrusion and two side edges, extending along the side surfaces, and the two side edges and the center protrusion form edge channels fluidically coupling the first fluid channel and the third fluid channel and, separately, fluidically coupling the second fluid channel and the fourth fluid channel.

12. The method of claim 10, wherein the swappable battery module further comprises a handle coupled to a side of the tubular enclosure adjacent to the second surfaces of the prismatic battery cells.

13. The method of claim 1, wherein the second end plate comprises:

a first cavity fluidically coupling the first fluid channel and the second fluid channel, and a second cavity fluidically coupling the third fluid channel and the fourth fluid channel.

14. The method of claim 1, wherein:

the swappable battery module further comprises sensor wires functionally coupled to each of the prismatic battery cells and a battery management system, electronically coupled to each of the sensor wires, the first end plate comprises an outer cavity such that the battery management system is positioned with the outer cavity, and the first end plate further comprises a passthrough such that the sensor wires protrude through the passthrough and are sealed within the passthrough.

15. The method of claim 1, wherein each adjacent pair of the prismatic battery cells is mechanically interconnected by an adhesive layer extending between the prismatic battery cells in each adjacent pair.

16. A method of operating a swappable battery module, the method comprising:

positioning the swappable battery module on an external charger comprising charger fluidic ports, wherein:

the swappable battery module comprises prismatic battery cells, a tubular enclosure, attached to and enclosing the prismatic battery cells, a first end plate attached to the tubular enclosure, and a second end plate attached to the tubular enclosure, the tubular enclosure forms a first fluid channel, a second fluid channel, a third fluid channel, and a fourth fluid channel with the prismatic battery cells, the first end plate comprises a first fluidic port, fluidically coupled to both the first fluid channel and the third fluid channel, and a second fluidic port, fluidically coupled to both the second fluid channel and the fourth fluid channel, and the second end plate fluidically interconnects the first fluid channel and the third fluid channel and, separately, fluidically interconnects the second fluid channel and the fourth fluid channel;

sliding the first end plate toward the charger fluidic ports until the charger fluidic ports are fluidically coupled with the first fluidic port and the second fluidic port forming two fluidic couplings, wherein:

the first fluidic port and the second fluidic port are sealed prior to sliding the first end plate toward the charger fluidic ports and contacting the first fluidic port and the second fluidic port with the charger fluidic ports, each of the two fluidic couplings comprises a first component and a second component, the first component comprises a first body, a first seal, a first spool, a first spool seal, a slider, a first slider seal, and a first spring, the first spool is slidably coupled to the first body and to the slider and biased, relative to the first body, by the first spring, the first spool is sealed against the first body by the first seal, the second component comprises a second body, a second seal, a second spool, and a second spring, the second spool is slidably coupled to and biased, by the second spring, relative to the second body, and sliding the first end plate toward the charger fluidic ports comprises extending the first spool into the second body and sealing against the second body by the second seal; and charging the swappable battery module using the external charger while circulating a thermal fluid through the swappable battery module through the charger fluidic ports, the first fluidic port, and the second fluidic port, thereby establishing direct contact between the thermal fluid and the prismatic battery cells, resulting in immersion thermal transfer between the thermal fluid and the prismatic battery cells.

17. The method of claim 16, wherein:

the external charger comprises a charger base and a charger enclosure forming a set of module bays, each module bay in the set of module bays comprises a module support rail, and the module support rail supports the swappable battery module when the swappable battery module is positioned on the external charger and slid toward the charger fluidic ports.

18. The method of claim 17, wherein the module support rail aligns the charger fluidic ports relative to the first fluidic port and the second fluidic port.

19. The method of claim 17, wherein:

each module bay in the set of module bays comprises charger electric terminals, the first end plate of the swappable battery module further comprises a first electrical terminal and a second electrical terminal, both connected to the prismatic battery cells, and sliding the first end plate toward the charger fluidic ports further comprises forming electrical connections between the charger electric terminals and each of the first electrical terminal and the second electrical terminal.

20. The method of claim 17, wherein:

each module bay in the set of module bays comprises a limiting arm pivotably coupled to the charger enclosure, and the limiting arm comprises a limiting bar positioned at an end of the limiting arm that is proximate to the charger base such that pivoting the limiting arm changes a distance between the limiting bar and the charger base.

* * * * *